United States Patent
Huang et al.

(10) Patent No.: US 10,714,013 B2
(45) Date of Patent: Jul. 14, 2020

(54) WIRELESS DISPLAY SCAN LINE CONTROL

(71) Applicant: a.u. Vista, Inc., Milpitas, CA (US)

(72) Inventors: Yu-Sheng Huang, Hsinchu (TW); Wei-Min Cho, Hsinchu (TW)

(73) Assignee: A.U. VISTA, INC., Milpitas, CA (US)

( * ) Notice: Subject to any disclaimer, the term of this patent is extended or adjusted under 35 U.S.C. 154(b) by 13 days.

(21) Appl. No.: 16/284,416

(22) Filed: Feb. 25, 2019

(65) Prior Publication Data
US 2020/0020272 A1 Jan. 16, 2020

Related U.S. Application Data

(60) Provisional application No. 62/696,031, filed on Jul. 10, 2018.

(51) Int. Cl.
*G09G 3/3258* (2016.01)
*H01L 27/12* (2006.01)
(Continued)

(52) U.S. Cl.
CPC ......... *G09G 3/3258* (2013.01); *G02F 1/1368* (2013.01); *G02F 1/13452* (2013.01);
(Continued)

(58) Field of Classification Search
CPC ...... G09G 3/3258; G09G 3/2003; G09G 3/32; G09G 3/3614; G09G 3/3659;
(Continued)

(56) References Cited

U.S. PATENT DOCUMENTS 7,629,735 B2   12/2009  Ryu
2004/0189625 A1*  9/2004  Sato ................. G06K 19/07749
345/204

(Continued)

FOREIGN PATENT DOCUMENTS

CN   101118832 A   2/2008
CN   102683384 A   9/2012
(Continued)

*Primary Examiner* — Ariel A Balaoing
(74) *Attorney, Agent, or Firm* — Tim Tingkang Xia, Esq.; Locke Lord LLP

(57) ABSTRACT

A display panel includes a substrate, a pixel structure, a receiver antenna structure and a transmitter antenna structure. The pixel structure includes multiple pixels arranged in an array. The receiver antenna structure provides first signals to the pixels, and includes multiple receiver antennas. The transmitter antenna structure transmits wireless signals to the receiver antenna structure such that the receiver antenna structure generates the first signals, and includes multiple transmitter antennas. Each transmitter antenna one-to-one corresponds to one receiver antenna. The transmitter and receiver antenna structures may be disposed on different sides of the substrate, and each receiver antenna may have a corresponding hole formed on the substrate for filling a ferrite structure to enhance transmission efficiency thereof. Alternatively, the transmitter and receiver antenna structures may be disposed on the same side of the substrate, thus reducing the distance between the transmitter and receiver antennas and enhance transmission efficiency thereof.

20 Claims, 22 Drawing Sheets

(51) Int. Cl.
*H05K 1/02* (2006.01)
*H01Q 1/24* (2006.01)
*G02F 1/1345* (2006.01)
*G02F 1/1362* (2006.01)
*G02F 1/1368* (2006.01)
*G09G 3/32* (2016.01)
*G09G 3/36* (2006.01)
*H01L 25/16* (2006.01)
*G09G 3/20* (2006.01)
*H01L 27/32* (2006.01)

(52) U.S. Cl.
CPC ..... *G02F 1/136286* (2013.01); *G09G 3/2003* (2013.01); *G09G 3/32* (2013.01); *G09G 3/3614* (2013.01); *G09G 3/3659* (2013.01); *G09G 3/3677* (2013.01); *H01L 25/167* (2013.01); *H01L 27/1218* (2013.01); *H01L 27/326* (2013.01); *H01L 27/3211* (2013.01); *H01L 27/3276* (2013.01); *H01Q 1/24* (2013.01); *H05K 1/0213* (2013.01); *G09G 2300/0408* (2013.01); *G09G 2300/0426* (2013.01); *G09G 2300/0439* (2013.01); *G09G 2300/0814* (2013.01); *G09G 2300/0885* (2013.01); *G09G 2320/0219* (2013.01); *G09G 2370/16* (2013.01); *H01L 27/1255* (2013.01)

(58) Field of Classification Search
CPC .............. G09G 3/3677; G02F 1/13452; G02F 1/136286; G02F 1/1368; H01L 25/167; H01L 27/1218; H01L 27/3211; H01L 27/326; H01L 27/3276; H01Q 1/24; H05K 1/0213
See application file for complete search history.

(56) References Cited

U.S. PATENT DOCUMENTS

| | | | |
|---|---|---|---|
| 2005/0264647 A1* | 12/2005 | Rzeszewski | H04N 7/147 348/14.02 |
| 2006/0209884 A1* | 9/2006 | MacMullan | H04N 21/43615 370/465 |
| 2009/0021646 A1* | 1/2009 | Shao | H04N 21/2385 348/608 |
| 2009/0289265 A1* | 11/2009 | Roozeboom | H01L 25/0657 257/80 |
| 2010/0182207 A1* | 7/2010 | Miyata | H01Q 1/243 343/702 |
| 2016/0189818 A1* | 6/2016 | Liu | A61B 6/06 378/147 |
| 2018/0190182 A1* | 7/2018 | Li | G09G 3/22 |
| 2018/0301106 A1* | 10/2018 | Huang | G09G 3/3688 |

FOREIGN PATENT DOCUMENTS

| | | |
|---|---|---|
| CN | 104851892 A | 8/2015 |
| TW | M273740 U | 8/2005 |
| TW | I285334 B | 8/2007 |

\* cited by examiner

WIRELESS DISPLAY SCAN LINE CONTROL

CROSS-REFERENCE TO RELATED PATENT APPLICATION

This non-provisional application claims priority to and the benefit of, pursuant to 35 U.S.C. § 119(e), U.S. provisional patent application Ser. No. 62/696,031 filed Jul. 10, 2018. The disclosure of the above application is incorporated herein in its entirety by reference.

FIELD

The disclosure relates generally to display technology, and more particularly to a wireless display panel having a gate driver on array (GOA) design for scan line control and display devices using the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Generally, a display panel may include a peripheral non-display area, which is reserved for a plurality of integrated circuits (ICs), as the data drivers that provide data signals to the pixels of the display panel. In order to reduce or eliminate the peripheral non-display area, wireless transmission technology may be used to transmit the data signals, thus achieving high speed data transmission. For example, a wireless display device may include a transmitter antenna structure and a receiver antenna structure correspondingly provided, with the transmitter antenna structure having one or more transmitter antennas Tx and the receiver antenna structure having one or more receiver antennas Rx, thus forming one or more wireless data transmission pairs Tx-Rx. However, there is no specific design about the transmitter and receiver antenna structures and the corresponding components in the peripheral area that may enhance the transmission efficiency of the wireless data transmission pairs Tx-Rx in the wireless display device.

Therefore, a heretofore unaddressed need exists in the art to address the aforementioned deficiencies and inadequacies.

SUMMARY

One aspect of the disclosure relates to a display panel, which includes: a substrate defining a display area thereon, and having a first surface and a second surface opposite to each other; a pixel structure disposed on the first surface of the substrate and corresponding to the display area, the pixel structure comprising a plurality of pixels arranged in an array; a receiver antenna structure disposed on the substrate and corresponding to the pixel structure, configured to provide data signals to the pixels, wherein the receiver antenna structure comprises a plurality of receiver antennas; and a transmitter antenna structure facing the second surface of the substrate and spatially separated from the receiver antenna structure, configured to transmit wireless signals to the receiver antenna structure, wherein the transmitter antenna structure comprises a plurality of transmitter antennas one-to-one corresponding to the receiver antennas; wherein each of the receiver antennas corresponds to a corresponding hole formed on the substrate.

In certain embodiments, the receiver antenna structure is disposed on the first surface of the substrate, and the transmitter antenna structure is disposed to face the second surface of the substrate, such that the substrate is located between the receiver antenna structure and the transmitter antenna structure.

In certain embodiments, the corresponding hole to each of the receiver antennas is formed to align with a center of each of the receiver antennas along a vertical direction perpendicular to the substrate, and a ferrite structure is filled in the corresponding hole.

In certain embodiments, the corresponding hole to each of the receiver antennas is a through hole penetrating through the first surface and the second surface of the substrate.

In certain embodiments, the receiver antenna structure is disposed on the second surface of the substrate facing the transmitter antenna structure.

In certain embodiments, the corresponding hole to each of the receiver antennas is a through hole penetrating through the first surface and the second surface of the substrate, and a feeding end of each of the receiver antennas is electrically connected to a plurality of corresponding pixels of the pixels through a conductive structure filled in the corresponding hole.

In certain embodiments, the display panel further includes: a gate driver disposed in a peripheral area on the first surface of the substrate; a plurality of connecting structures disposed in the peripheral area of the substrate and electrically connected to the gate driver; a printed circuit board (PCB) disposed to be spatially separated from the substrate and facing the second surface of the substrate, wherein the transmitter antenna structure is disposed on the PCB; a control driver disposed on the PCB, configured to generate a plurality of scan signals for the gate driver; and a plurality of protrusion contacts convexly disposed on the PCB and electrically connected to the control driver; wherein each of the connecting structures corresponds to one of the protrusion contacts, and each of the connecting structures has a contact end disposed on the second surface of the substrate to be in direct contact with a corresponding one of the protrusion contacts, such that the control driver transmits the scan signals to the gate driver through the protrusion contacts and the connecting structures.

In certain embodiments, each of the connector structures has a side wiring portion disposed on a side surface of the substrate, and the contact end of each of the connector structures is electrically connected to the gate driver on the first surface of the substrate through the side wiring portion.

In certain embodiments, each of the connector structures is filled in a corresponding through hole penetrating through the first surface and the second surface of the substrate, and the contact end of each of the connector structures is exposed on the second surface of the substrate from the corresponding through hole.

In certain embodiments, the display panel is a light emitting diode (LED) display panel, and each of the pixels includes a LED disposed on the first side of the substrate.

In certain embodiments, the display panel is a liquid crystal display (LCD) panel, and the display panel further includes a backlight module disposed between the receiver antenna structure and the transmitter antenna structure.

Another aspect of the disclosure relates to a display panel, which includes: a substrate defining a display area thereon, and having a first surface and a second surface opposite to each other; a pixel structure disposed on the substrate and corresponding to the display area, the pixel structure comprising a plurality of pixels arranged in an array; a receiver antenna structure disposed on the second surface of the substrate and corresponding to the pixel structure, configured to provide data signals to the pixels, wherein the receiver antenna structure comprises a plurality of receiver antennas; and a transmitter antenna structure facing the second surface of the substrate and spatially separated from the receiver antenna structure, configured to transmit wireless signals to the receiver antenna structure, wherein the transmitter antenna structure comprises a plurality of transmitter antennas one-to-one corresponding to the receiver antennas.

In certain embodiments, the pixel structure is disposed on the first surface of the substrate, each of the receiver antennas corresponds to a corresponding through hole penetrating through the first surface and the second surface of the substrate, and a feeding end of each of the receiver antennas is electrically connected to a plurality of corresponding pixels of the pixels through a conductive structure filled in the corresponding through hole.

In certain embodiments, the display panel further includes: a gate driver disposed in a peripheral area on the first surface of the substrate; a plurality of connecting structures disposed in the peripheral area of the substrate and electrically connected to the gate driver; a printed circuit board (PCB) disposed to be spatially separated from the substrate and facing the second surface of the substrate, wherein the transmitter antenna structure is disposed on the PCB; a control driver disposed on the PCB, configured to generate a plurality of scan signals for the gate driver; and a plurality of protrusion contacts convexly disposed on the PCB and electrically connected to the control driver; wherein each of the connecting structures corresponds to one of the protrusion contacts, and each of the connecting structures has a contact end disposed on the second surface of the substrate to be in direct contact with a corresponding one of the protrusion contacts, such that the control driver transmits the scan signals to the gate driver through the protrusion contacts and the connecting structures.

In certain embodiments, each of the connector structures has a side wiring portion disposed on a side surface of the substrate, and the contact end of each of the connector structures is electrically connected to the gate driver on the first surface of the substrate through the side wiring portion.

In certain embodiments, each of the connector structures is filled in a corresponding through hole penetrating through the first surface and the second surface of the substrate, and the contact end of each of the connector structures is exposed on the second surface of the substrate from the corresponding through hole.

In certain embodiments, the pixel structure is disposed on the second surface of the substrate, and the receiver antenna structure is located between the pixel structure and the transmitter antenna structure.

In certain embodiments, the display panel further includes: a gate driver disposed in a peripheral area on the second surface of the substrate; a plurality of connecting structures disposed in the peripheral area on the second surface of the substrate and electrically connected to the gate driver; a printed circuit board (PCB) disposed to be spatially separated from the substrate and facing the second surface of the substrate, wherein the transmitter antenna structure is disposed on the PCB; a control driver disposed on the PCB, configured to generate a plurality of scan signals for the gate driver; and a plurality of protrusion contacts convexly disposed on the PCB and electrically connected to the control driver; wherein each of the connecting structures is in direct contact with a corresponding one of the protrusion contacts, such that the control driver transmits the scan signals to the gate driver through the protrusion contacts and the connecting structures.

In certain embodiments, the display panel is a light emitting diode (LED) display panel, and each of the pixels includes a LED.

In certain embodiments, the display panel is a liquid crystal display (LCD) panel, and the display panel further includes a backlight module disposed between the receiver antenna structure and the transmitter antenna structure.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1A:
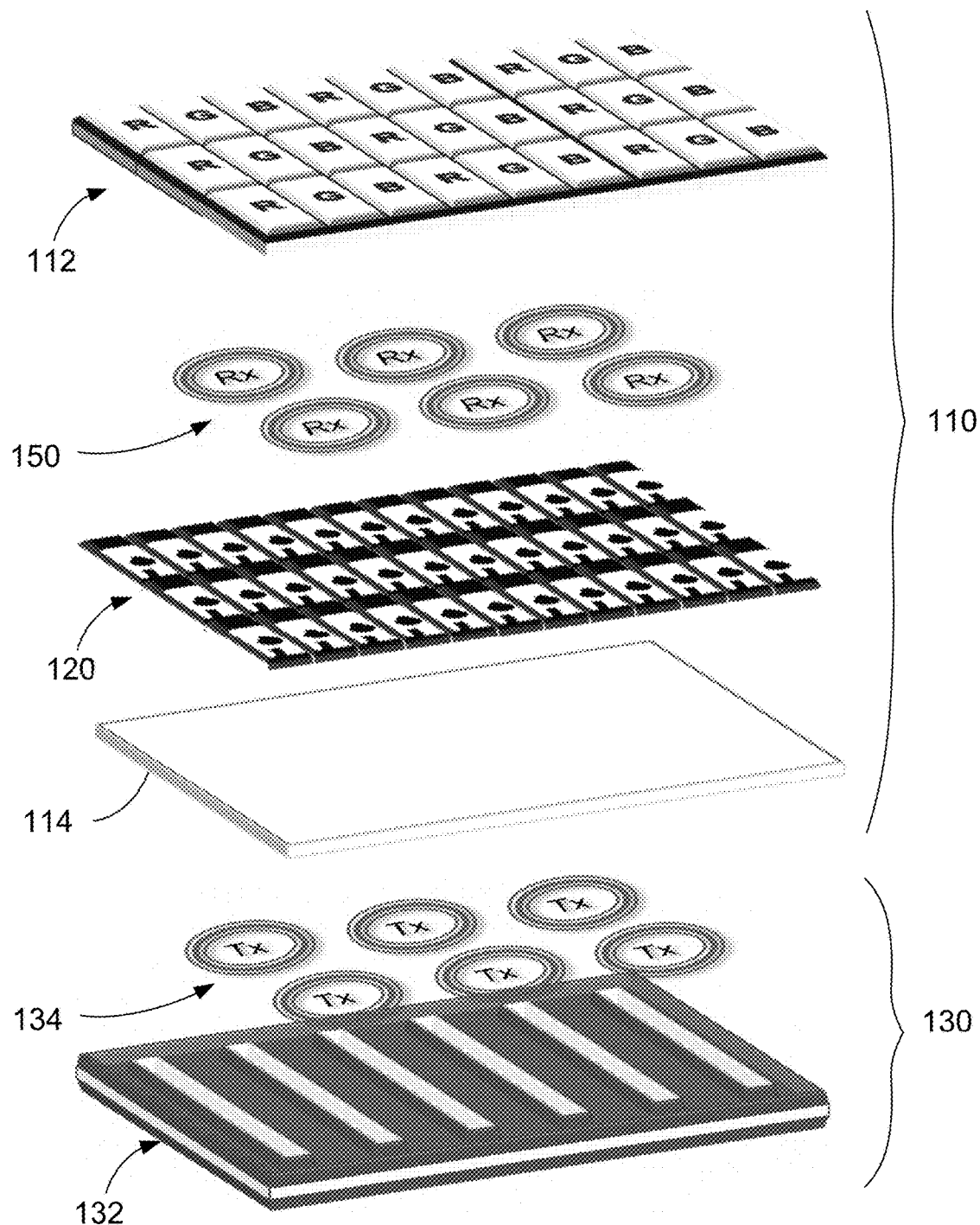
FIG. 1A schematically shows an exploded view of a display panel of a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the "feeding end" of a receiver antenna refers to the "actual" feeding end being electrically connected to a corresponding signal line. Generally, a receiver antenna has an outer feeding end and an inner feeding end, where one of the outer feeding end and the inner feeding end serves as the "feeding end" and the other of the outer feeding end and the inner feeding end serves as a reference end, which may be grounded or electrically connected to a reference voltage level (such as the common voltage $V_{COM}$ provided by a common electrode).

The description will be made as to the embodiments of the present disclosure in conjunction with the accompanying drawings. In accordance with the purposes of this disclosure, as embodied and broadly described herein, this disclosure, in certain aspects, relates to a wireless display panel with multi-channel data transmission and a display device using the same.

One aspect of the disclosure relates to a display panel, which uses light emitting diodes (LEDs) as an active matrix. For example, FIG. 1A schematically shows an exploded view of a display panel according to certain embodiments of the present disclosure. As shown in FIG. 1A, the display panel 100 is a color micro LED (µLED) display panel, which includes a display cell 110, a transmitter antenna structure 130, and a receiver antenna structure 150. The display cell 110 includes, from the image display side (top side of FIG. 1) toward a back side (bottom side of FIG. 1), a micro LED chip layer 112, a TFT array 120 and a glass substrate 114. The micro LED chip layer 112 includes multiple micro LED chips arranged in an array, where each micro LED chip may emit light in a corresponding RGB color (red, green and blue). Thus, the display cell 610 does not require a color filter layer, and the display panel 100 does not include a backlight module. The receiver antenna structure 150 is formed by a plurality of receiver antennas Rx and is disposed on the TFT array 120, and the receiver antenna structure 150 and the TFT array 120 are disposed on the glass substrate 114. The transmitter antenna structure 150 is formed by a transmitter antenna layer 154 disposed on a printed circuit board (PCB) 152, where the transmitter antenna layer 154 includes a plurality of transmitter antennas Tx 154 and the PCB 152 is spatially separated from the glass substrate 114, such that the transmitter antenna structure 130 as a whole is spatially separated from the receiver antenna structure 150. In other words, a distance exists between the transmitter antenna structure 130 and the receiver antenna structure 150 to facilitate high speed wireless data transmission between the transmitter antenna structure 130 and the receiver antenna structure 150. Each of the transmitter antennas Tx one-to-one corresponds to one of the receiver antennas Rx, and each of the transmitter antennas Tx has an identical resonance frequency to the resonance frequency of the corresponding receiver antenna Rx.

In the display cell 110, the TFT array 120 and the micro LED chip layer 112 correspondingly define a pixel structure, which corresponds to a display area of the display panel 100.

Specifically, the pixel structure includes a plurality of pixels arranged in an array having M columns and N rows, where M and N are positive integers. For each pixel of the pixel structure, a corresponding TFT in the TFT array 120 and a corresponding set of micro LED chips in the micro LED chip layer 112 are provided, where one TFT and one micro LED chip corresponds to one sub-pixel R, G or B of the pixel.

In certain embodiments, the display panel 100 may include other layers or structures not shown in FIG. 1A. For example, the TFT array 120 may include a plurality of signal lines, such as the data lines and gate lines. Further, multiple insulating films or layers may be provided in the pixel structure (i.e., the TFT array 120 and the micro LED chip layer 112). Moreover, since there is no backlight module between the TFT array 120 and the transmitter antenna structure 130, other layers or structures may exists between the TFT array 120 and the transmitter antenna structure 130 to prevent the TFT array 120 and the transmitter antenna structure 130 from directly contacting each other.

Figure 1B:
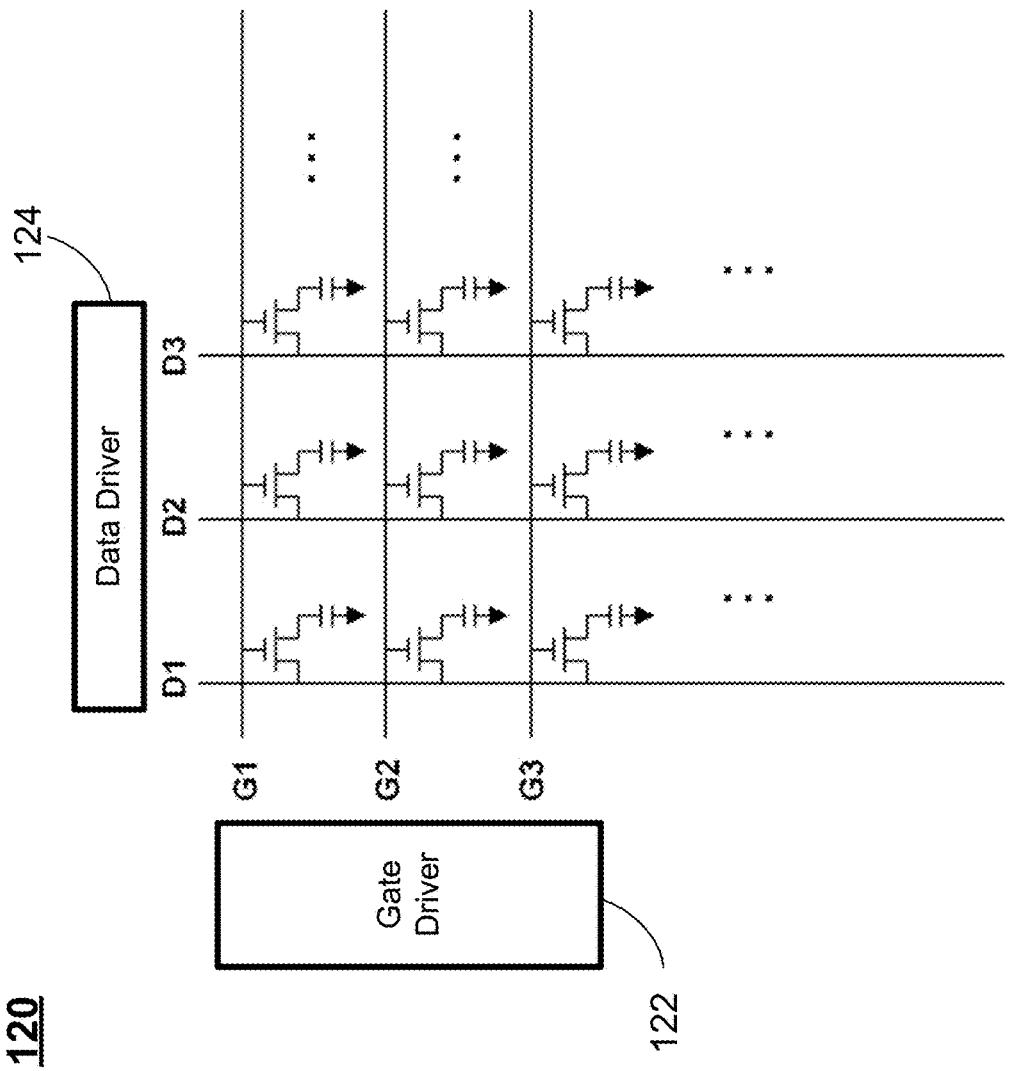
FIG. 1B schematically shows a part of a TFT array according to certain embodiments of the present disclosure.

FIG. 1B schematically shows a part of a TFT array according to certain embodiments of the present disclosure. As shown in FIG. 1B, the TFT array 120 includes a plurality of TFTs arranged in an array, where each of the TFT corresponds to a pixel of the pixel structure. In other words, for the pixel structure that includes a plurality of pixels arranged in an array having M columns and N rows, the TFT array 120 also includes a plurality of TFTs arranged in an array having M columns and N rows. Further, a plurality of data lines D1, D2, D3 . . . and a plurality of gate lines G1, G2, G3 . . . are provided in the pixel structure. Each of the data lines D1, D2, D3 is electrically connected to the sources of the TFTs in a corresponding column, and each of the gate lines G1, G2, G3 is electrically connected to the gates of the TFTs in a corresponding row. A gate driver 122 is connected to the gate lines G1, G2, G3 for providing gate signals to the gate lines, and a data driver 124 is connected to the data lines D1, D2, D3 for providing data signals to the data lines. In certain embodiments, the gate driver 122 and the data driver 124 are respectively provided at the border area of the display panel. In certain embodiments, multiple gate drivers 122 may be provided. In certain embodiments, multiple data drivers 124 may be provided.

Figure 2A:
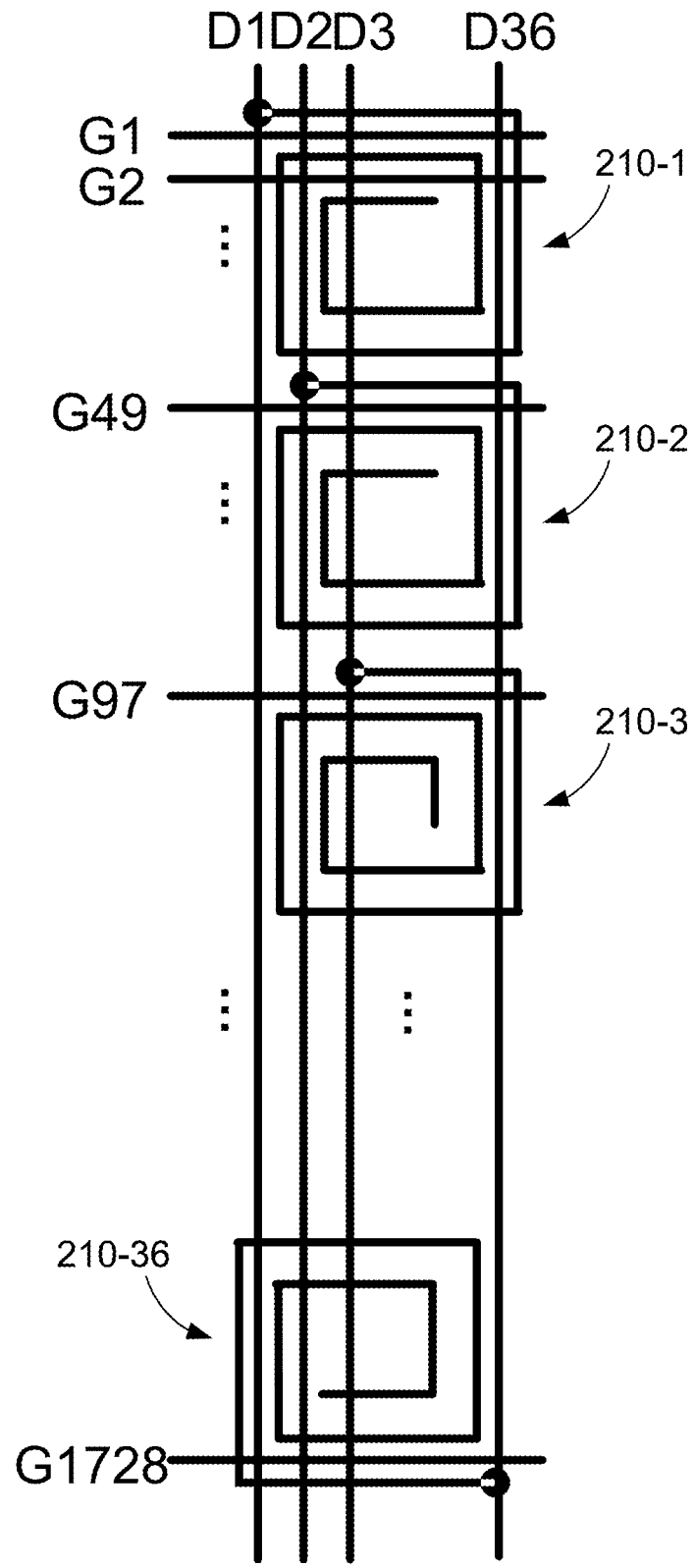
FIG. 2A schematically shows the connections between a row of receiver antennas in a receiver antenna structure and corresponding data lines in the pixel structure according to certain embodiments of the present disclosure.

FIG. 2A schematically shows the connections between a row of receiver antennas in a receiver antenna structure and corresponding data lines according to certain embodiments of the present disclosure. As shown in FIG. 2A, the pixel structure 200 includes 36 data lines D1 to D36 from left to right, and 1728 gate lines G1 to G1728 from top to bottom. Correspondingly, the receiver antenna structure includes 36 receiver antennas 210-1 to 210-36 arranged in a column. Each of the 36 data lines D1 to D36 is electrically connected to a corresponding one of the 36 receiver antennas 210-1 to 210-36 at the outer feeding end, and the inner feeding end of each of the 36 receiver antennas 210-1 to 210-36 is grounded. In other words, the number of the receiver antennas in a column is the same as the number of the corresponding data lines.

As shown in FIG. 2A, each of the receiver antennas 220-1 to 220-36 is electrically connected to the corresponding data lines D1 to D36 at the outer feeding end of the receiver antenna. In certain embodiments, each of the receiver antennas can be electrically connected to the corresponding data line at either one of the outer feeding end and the inner feeding end thereof. In this case, the other of the outer feeding end and the inner feeding end of the receiver antenna which is not being electrically connected to the corresponding data line may be grounded.

Further, as shown in FIG. 2A, the receiver antennas 220-1 to 220-36 are electrically connected to the corresponding data lines D1 to D36. In certain embodiments, the receiver antennas can be electrically connected to corresponding signal lines, where the signal lines can be data lines, gate lines or other signal lines of the display panel.

Figure 2B:
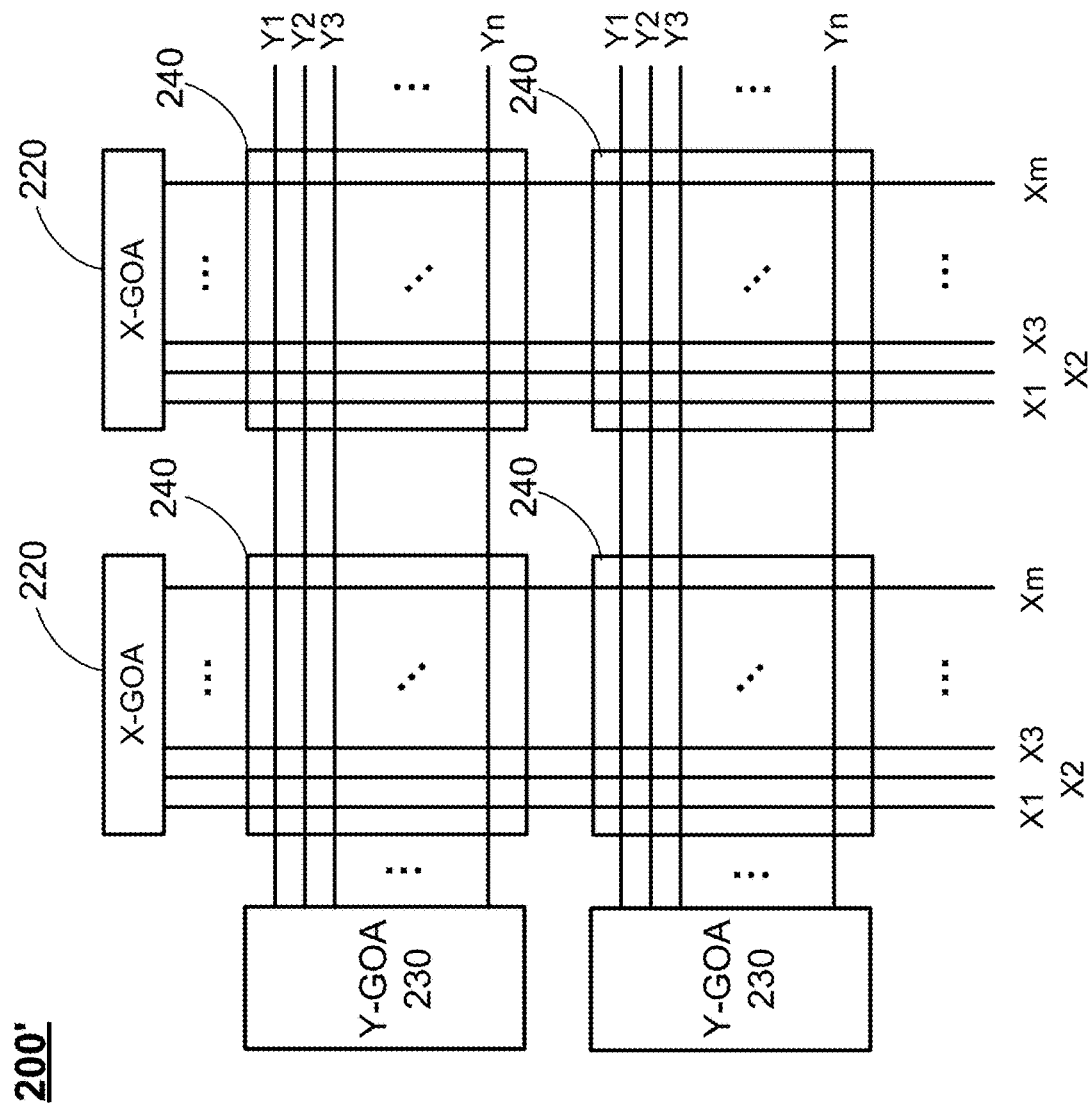
FIG. 2B schematically shows the connections between a matrix of receiver antenna groups in a receiver antenna structure and corresponding scan lines according to certain embodiments of the present disclosure.

As discussed above, in certain embodiments, the display panel may include other signal lines, and these signal lines may be provided in a different arrangement corresponding with the receiver antenna structure. For example, FIG. 2B schematically shows the connections between a matrix of receiver antenna groups in a receiver antenna structure and corresponding scan lines according to certain embodiments of the present disclosure. As shown in FIG. 2B, the pixel structure 200' are divided into a plurality of receiver antenna groups 240, where each receiver antenna group 240 has one receiver antenna (not shown in FIG. 2B). Further, m*n pixels correspond to the same receiver antenna (not shown in FIG. 2B) in the receiver antenna group 240 such that the same receiver antenna transmits the data signals to the m*n pixels, where m and n are positive integers. Moreover, at a peripheral area of the pixel structure 200', multiple gate drivers on array (GOAs) 220 and 230 are respectively arranged in along the row direction and the column direction as shown in FIG. 2B. Specifically, each X-GOA 220 represents a GOA located at the top side of FIG. 2B, which is electrically connected to m scan lines X1, X2, X3, . . . Xm extending in the column direction (i.e. the X direction); and each Y-GOA 230 represents a GOA located at the left side of FIG. 2B, which is electrically connected to n scan lines Y1, Y2, Y3, . . . Yn extending in the row direction (in the Y direction). In this case, for each of the pixels corresponding to one of the receiver antenna groups 240, the pixel circuit of the pixel may include multiple scan transistors or switches, where at least one of the scan transistors is controlled by a scan signal transmitted through a corresponding one of the m scan lines X1, X2, X3, . . . Xm in the X direction, and at least one of the scan transistors is controlled by a scan signal transmitted through a corresponding one of the n scan lines Y1, Y2, Y3, . . . Yn in the Y direction, such that the pixel may be controlled by the scan signals to receive the data signal being transmitted by the corresponding receiver antenna.

Figure 3:
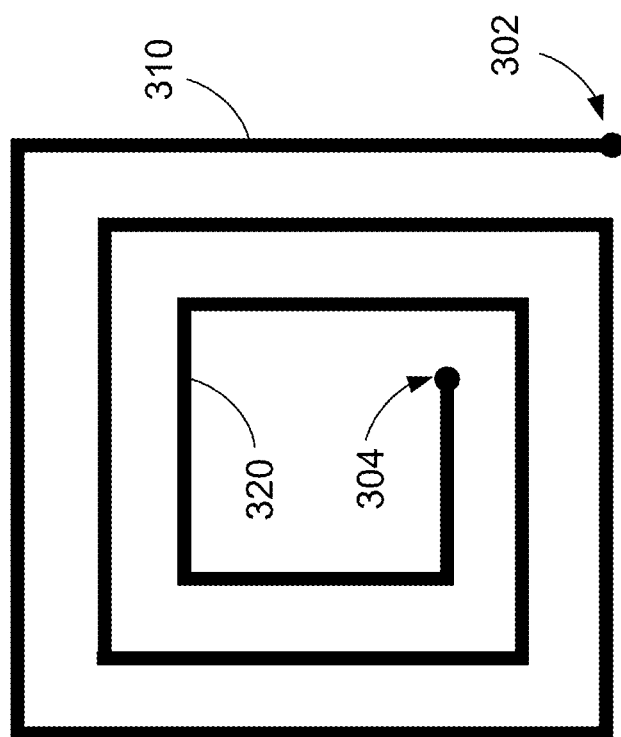
FIG. 3 schematically shows a top view of an antenna according to certain embodiments of the present disclosure.

FIG. 3 schematically shows an antenna according to certain embodiments of the disclosure. Specifically, the antenna 300 as shown in FIG. 3 can be used as a receiver antenna Rx in the receiver antenna structure 150 as shown in FIG. 1A. As shown in FIG. 3, the antenna 300 is winding from an outer feeding end 302 inward to an inner feeding end 304 in a counter-clockwise direction. In certain embodiments, the winding direction of the antenna 200 can be either clockwise or counter-clockwise. Further, and the antenna 300 includes a plurality of vertical segments 310 and horizontal segments 320, forming a plurality of turns of wires. As shown in FIG. 3, the winding number of the antenna 300 has a winding number N=3, indicating that the antenna 300 has three turns of wires. In certain embodiments, the winding number N of the antenna 300 may be determined based on the desired transmission characteristics of the antenna 300.

In certain embodiments, the transmission characteristics of an antenna may be described in the form of an induced decibel (dB), which reflects the transmission performance of the antenna. In the wireless transmission field, the value of the induced dB of an antenna indicates a ratio Rx/Tx, which refers to the ratio of the receiver antenna Rx to the transmitter antenna Tx of the antenna. For example, if a power ratio of the Rx/Tx is X, the amplitude ratio of the Rx/Tx is $(X)^{1/2}$, and the induced dB of the antenna is $10*\log_{10} X$. Generally, an antenna having an induced dB that is greater than −10 dB indicates an acceptable performance for the wireless transmission of the antenna, and an antenna having an induced dB that is close to 0 dB indicates an excellent performance (i.e., minimum transmission loss) for the wireless transmission of the antenna.

As stated above, in a display panel, each of the transmitter antennas Tx has an identical resonance frequency to the resonance frequency of the corresponding receiver antenna Rx, thus forming multiple wireless data transmission pairs Tx-Rx having different resonance frequencies. However, the wireless data transmission between the wireless data transmission pairs Tx-Rx may interfere with one another, which negatively affects the transmission performances for some of the wireless data transmission pairs Tx-Rx. In view of this deficiency, certain aspects of the present disclosure propose a feature that changes the structural arrangements of the receiver antennas Rx in order to reduce the signal interference between the wireless data transmission pairs Tx-Rx.

Figure 4:
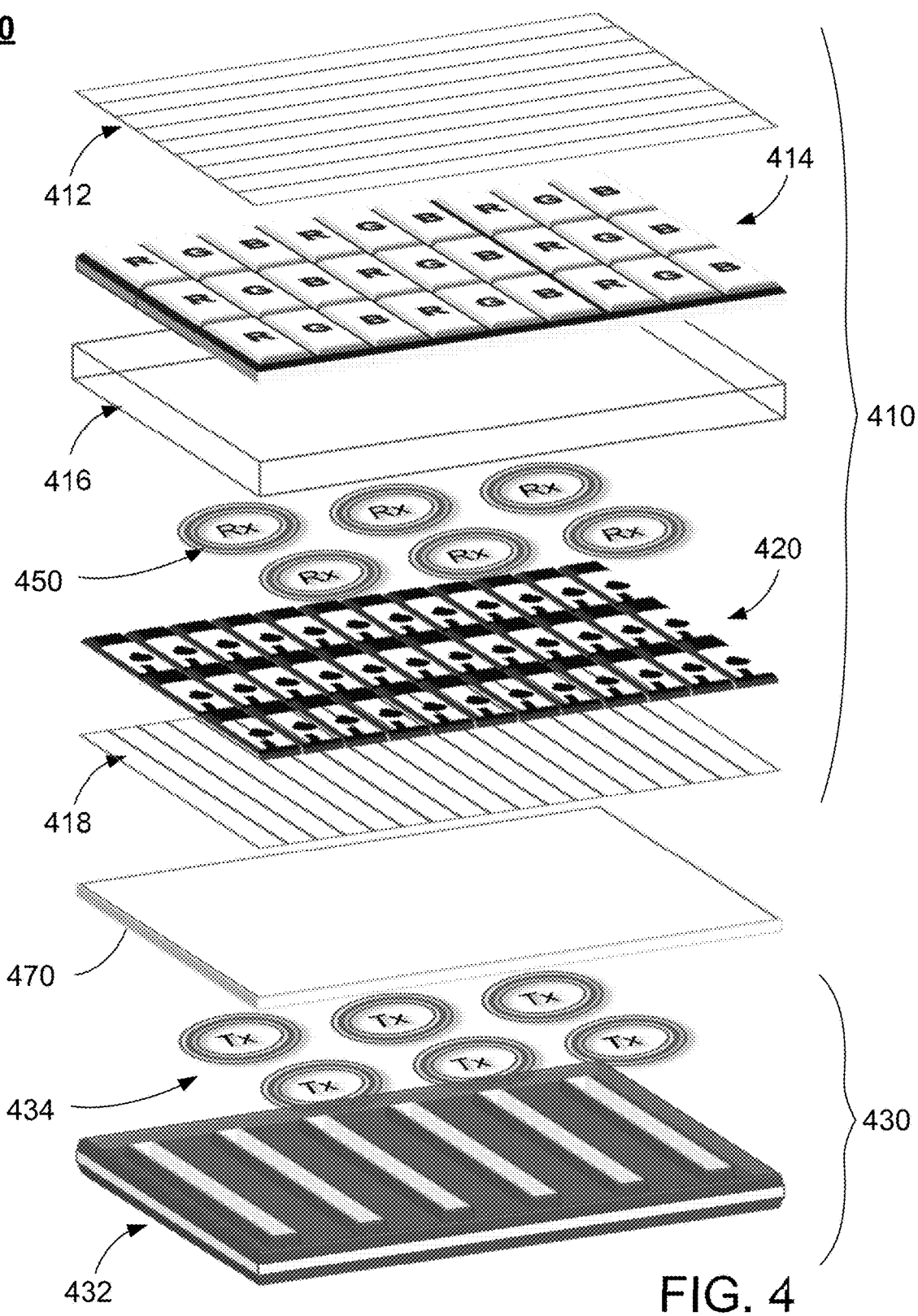
FIG. 4 schematically shows an exploded view of a display panel of a display device according to certain embodiments of the present disclosure.

Further, it should be noted that the features as described above are not limited to the LED display panel 100 as shown in FIG. 1A, and may apply to other types of display panels, such as liquid crystal display (LCD) panels. For example, FIG. 4 schematically shows an exploded view of a display panel according to certain embodiments of the present disclosure. As shown in FIG. 4, the display panel 400 is a color liquid crystal display (LCD) panel, which includes a display cell 410, a transmitter antenna structure 430, a receiver antenna structure 450 and a backlight module 470. The display cell 410 includes, from the image display side (top side of FIG. 4) toward a backlight side (bottom side of FIG. 4), a first polarizer 412, a color filter layer 414, a liquid crystal layer 416, a TFT array 420 and a second polarizer 418. The receiver antenna structure 150 is formed by a plurality of receiver antennas Rx and is disposed on the TFT array 420. A glass substrate (not shown in FIG. 4) may be provided between the TFT array 420 and the second polarizer 418, such that the TFT array 420 and the receiver antenna structure 450 may be disposed on the glass substrate. The backlight module 470 is disposed between the display cell 410 and the transmitter antenna structure 450 to emit light toward the display cell 410. The transmitter antenna structure 450 is formed by a transmitter antenna layer 454 disposed on a printed circuit board (PCB) 452, where the transmitter antenna layer 454 includes a plurality of transmitter antennas Tx and is disposed on the PCB 432, such that the transmitter antenna structure 430 is spatially separated from the receiver antenna structure 450. In other words, a distance exists between the transmitter antenna structure 430 and the receiver antenna structure 450 to facilitate high speed wireless data transmission between the transmitter antenna structure 430 and the receiver antenna structure 450. Each of the transmitter antennas Tx one-to-one corresponds to one of the receiver antennas Rx, and each of the transmitter antennas Tx has an identical resonance frequency to the resonance frequency of the corresponding receiver antenna Rx.

In the display cell 410, the TFT array 420, the liquid crystal layer 416 and the color filter layer 414 correspondingly define a pixel structure, which corresponds to a display area of the display panel 400. Specifically, the pixel structure includes a plurality of pixels arranged in an array having M columns and N rows, where M and N are positive integers.

For each pixel of the pixel structure, a corresponding TFT in the TFT array 420 and a corresponding set of color filters in the color filter layer 414 are provided.

In certain embodiments, the display panel 400 may include other layers or structures not shown in FIG. 4. For example, multiple insulating films or layers may be provided in the pixel structure (i.e., the TFT array 420, the liquid crystal layer 416 and the color filter layer 414).

Figure 5A:
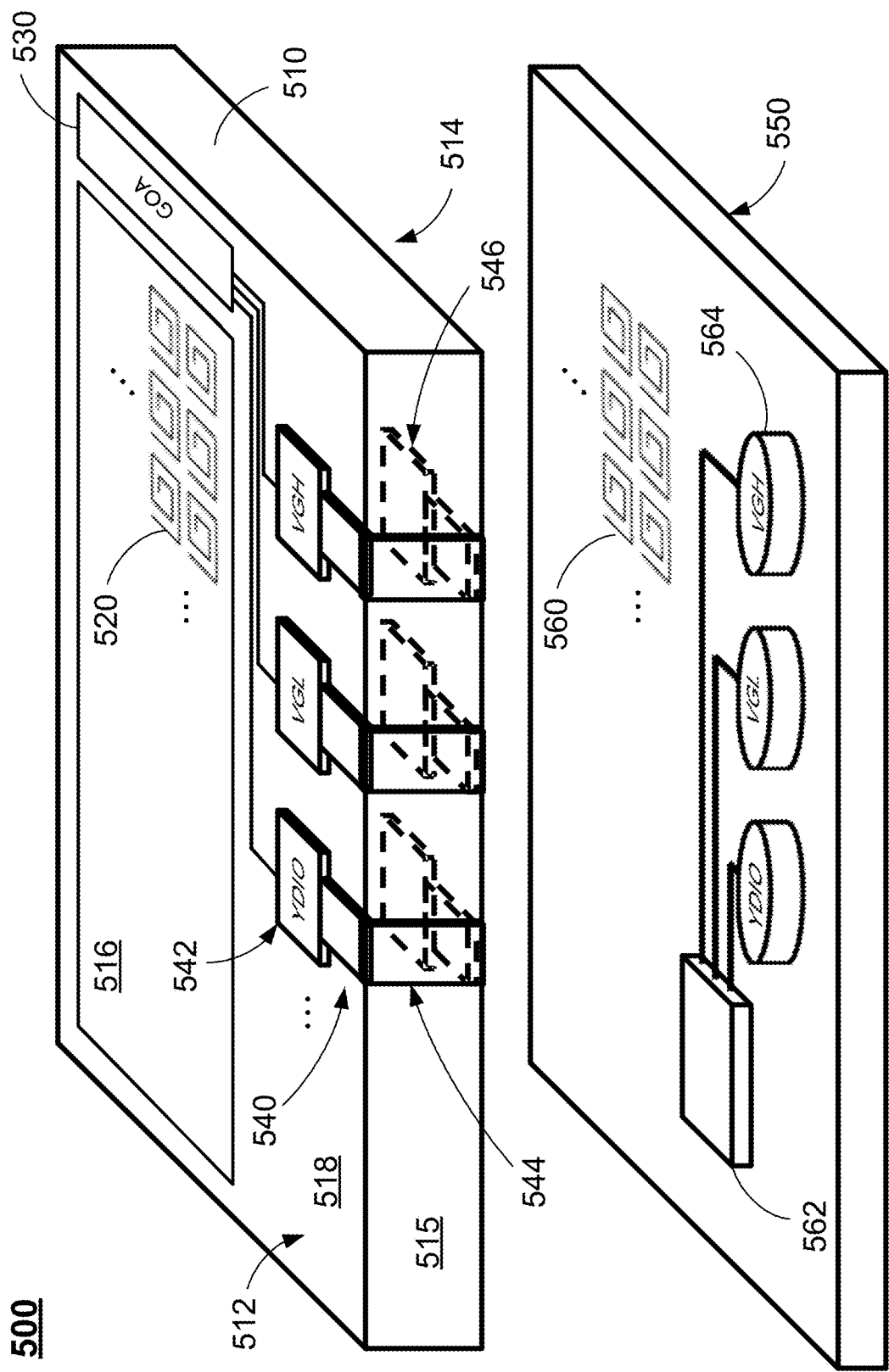
FIG. 5A schematically shows an exploded view of the receiver antenna structure and the transmitter antenna structure of a display panel according to certain embodiments of the present disclosure, where the connecting structures are formed by side wiring.
Figure 5B:
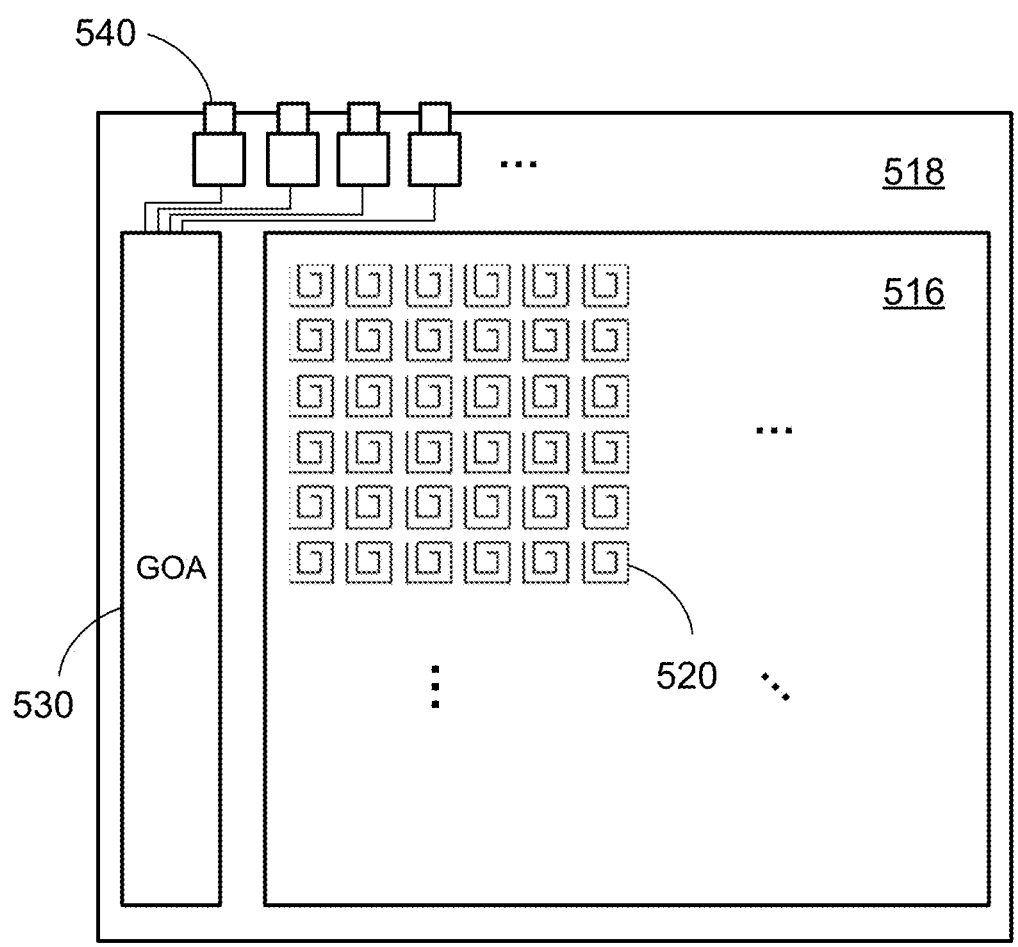
FIG. 5B schematically shows a top view of the receiver antenna structure and the connecting structures as shown in FIG. 5A according to certain embodiments of the present disclosure.

FIG. 5A schematically shows an exploded view of the receiver antenna structure and the transmitter antenna structure of a display panel according to certain embodiments of the present disclosure, and FIG. 5B schematically shows a top view of the receiver antenna structure and the connecting structures as shown in FIG. 5A. As shown in FIG. 5A, the display panel 500 include a glass substrate 510 and a PCB 550 spatially distanced from each other. The glass substrate 510 has a first surface 512 (i.e., the top surface as shown in FIG. 5A), a second surface 514 (i.e., the bottom surface facing the PCB 550 as shown in FIG. 5A), and a side surface 515 (i.e., the front surface as shown in FIG. 5A). As shown in FIG. 5B, in the first surface 512 of the substrate 510, a display area 516 is defined, where the receiver antenna structure 520 is disposed in the display area 516. Thus, the area outside the display area 516 is defined as a peripheral area 518. A gate driver on array (GOA) 530 is disposed in the peripheral area 518. Further, multiple connecting structures 540 are provided to be electrically connected to the GOA 530 to facilitate transmission of signals for the GOA 530. Specifically, referring back to FIG. 5A, each connecting structure 540 has a pad 542 disposed in the peripheral area 518 on the first surface 512, a contact end 546 disposed on the second surface 514, and a side wiring portion 544 disposed on the side surface 515 by side wiring to connect the pad 542 to the contact end 546. On the other hand, the PCB 550 is provided with the transmitter antenna structure 560, a control driver 562 and multiple protrusion contacts 564 disposed thereon. The control driver is used to generate scan signals for the GOA 530. Each of the protrusion contacts 564 is convexly disposed on the PCB 550 and electrically connected to the control driver 562, and directly faces a corresponding one of the contact ends 546 of the connecting structures 540 disposed on the second surface 514 of the glass substrate 510. The protrusion contacts 564 protrude from the PCB 550 with a certain height, allowing the protrusion contacts 564 to be in direct contact with the corresponding contact ends 546, such that the protrusion contacts 564 and the corresponding connecting structures 540 are electrically connected to each other. In this case, the control driver 562 may transmit the scan signals to the GOA 530 through the protrusion contacts 564 and the connecting structures 540. Examples of the scan signals being transmitted may include, without being limited thereto, a high reference gate voltage $V_{GH}$, a low reference gate voltage $V_{GL}$, a start pulse signal YDIO, clock signals CK and XCK, or VSS or VDD signals.

Figure 6:
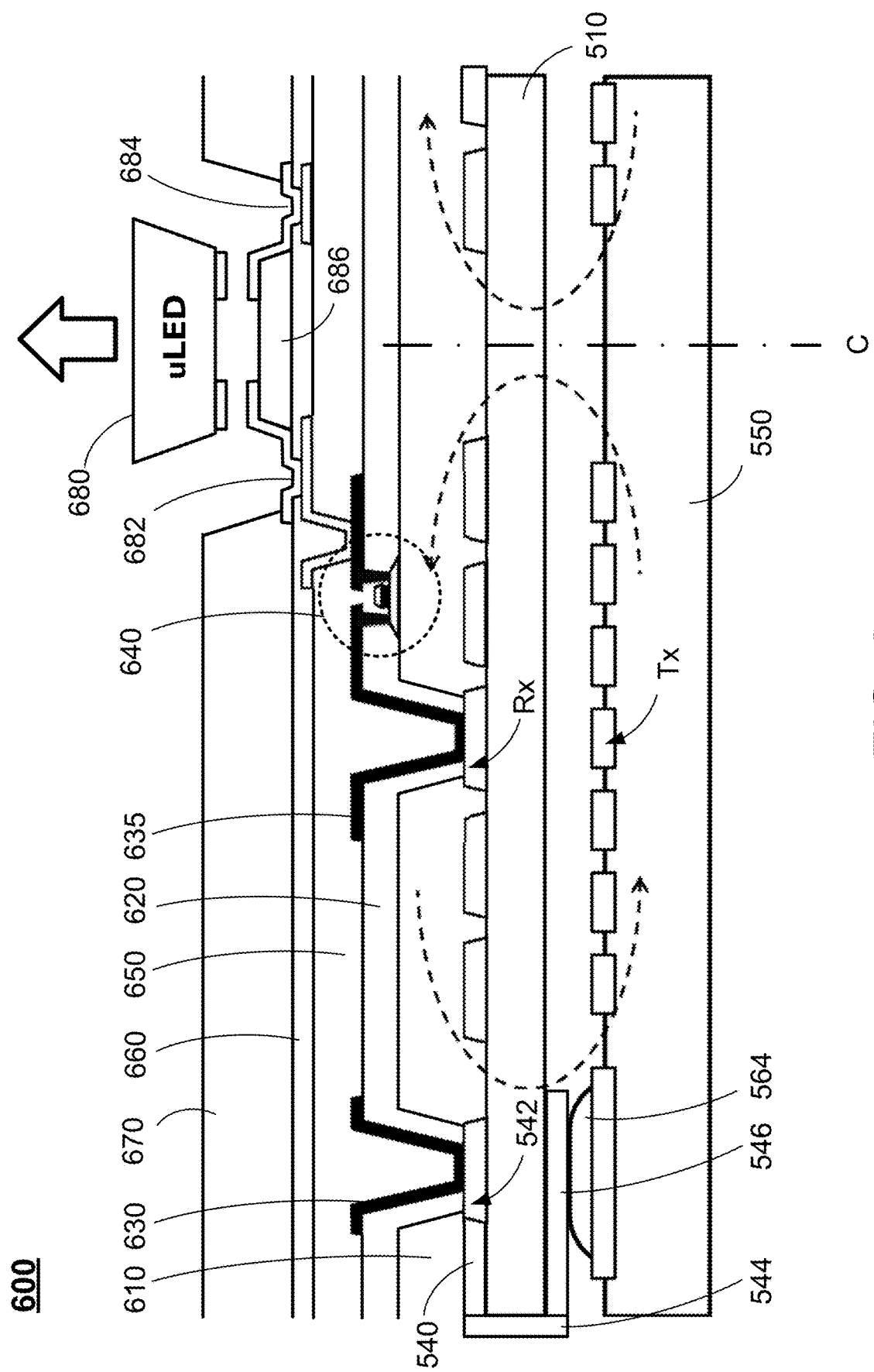
FIG. 6 schematically shows a sectional view of a LED display panel having the structure as shown in FIG. 5A according to certain embodiments of the present disclosure.

FIG. 6 schematically shows a sectional view of a LED display panel having the structure as shown in FIG. 5A according to certain embodiments of the present disclosure. As shown in FIG. 6, the display panel 600 is a micro LED display, which has the structure as shown in FIG. 5A. Specifically, the glass substrate 510 has a receiver antenna Rx disposed on the first surface thereof (i.e., the top surface of the glass substrate 510 as shown in FIG. 6), and a connecting structure 540 having the pad 542 disposed on the first surface of the substrate 510, the side wiring portion 544 disposed on a side surface of the substrate 510, and the contact end 546 disposed on the second surface of the substrate 510 (i.e., the bottom surface of the glass substrate 510 as shown in FIG. 6). The PCB 550 has a transmitter antenna Tx correspondingly disposed facing the glass substrate 510, and a protrusion contact 564 in direct contact with the corresponding contact end 546 of the connecting structure 540. The transmitter antenna Tx corresponds to the receiver antenna Rx in a way that a center line C showing the centers of the transmitter antenna Tx and the receiver antenna Rx to be substantially align with each other. Further, on top of the structure, the LED display panel 600 has a plurality of layers including, without being limited thereto, a first flatten layer 610, an interlayer dielectric (ILD) layer 620, a second flatten layer 650, an insulating layer 660, and a black matrix (BM) layer 670. Further, a micro LED chip 680 is disposed on the insulating layer 660 for emitting light. The micro LED chip 680 has an anode 682 and a cathode 684, and a bump 686 is disposed below the micro LED chip 680. A connecting wire 630 is formed between the ILD layer 620 and the second flatten layer 650 to electrically connect the connecting structure 540 to the GOA (not shown in FIG. 6A). Further, a data line 635 is formed between the ILD layer 620 and the second flatten layer 650 to electrically connect the receiver antenna Rx to the source electrode of the thin-film transistor 640. In certain embodiments, the connecting wire 630 and the data line 635 are formed as the same conductive layer. The drain electrode of the thin-film transistor 640 is electrically connected to the anode 682 of the micro LED chip 680.

Figure 7:
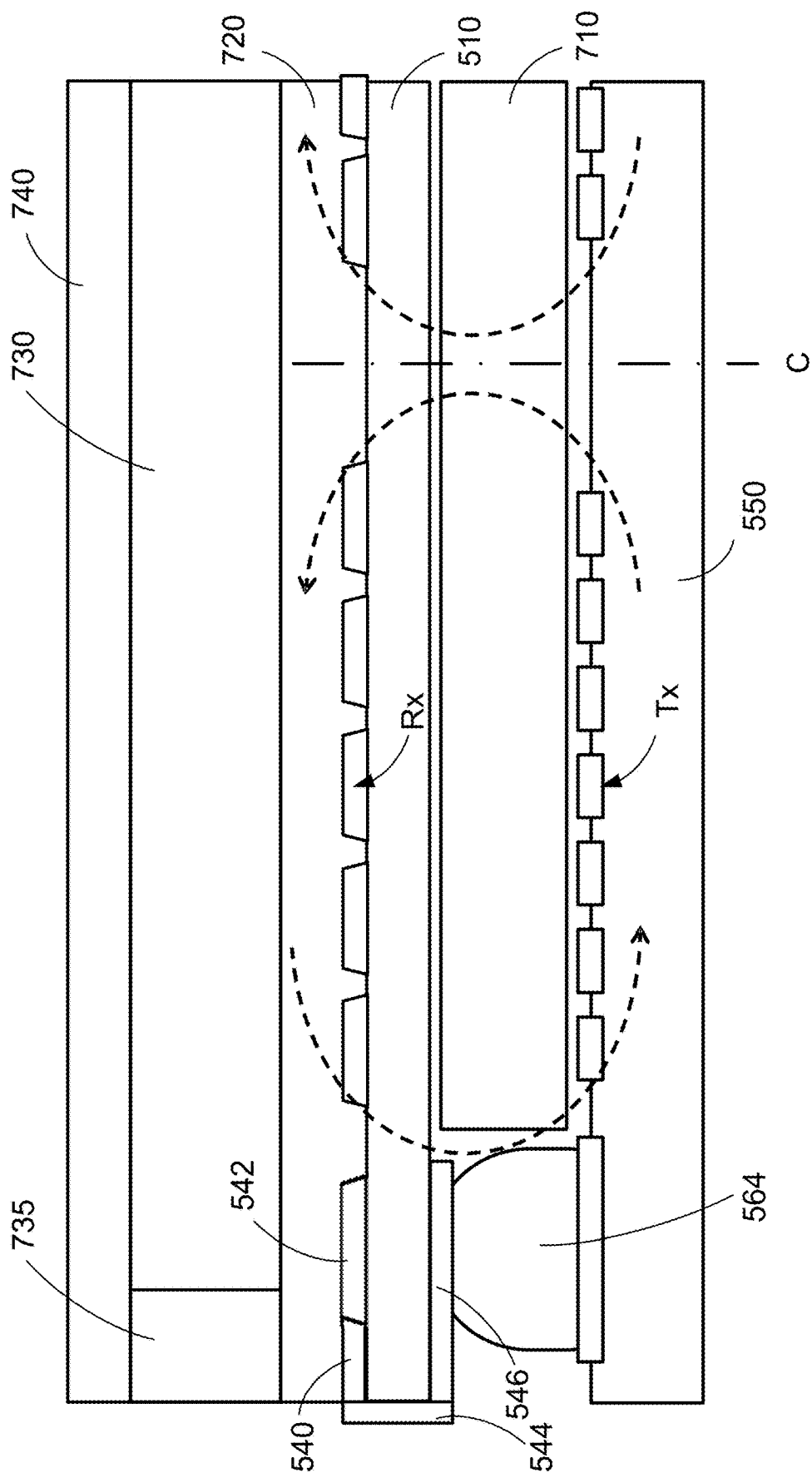
FIG. 7 schematically shows a sectional view of a LCD panel having the structure as shown in FIG. 5A according to certain embodiments of the present disclosure.

FIG. 7 schematically shows a sectional view of a LCD panel having the structure as shown in FIG. 5A according to certain embodiments of the present disclosure. As shown in FIG. 7, the display panel 700 is a LCD panel, which has the structure as shown in FIG. 5A. Specifically, the glass substrate 510 has a receiver antenna Rx disposed on the first surface thereof (i.e., the top surface of the glass substrate 510 as shown in FIG. 7), and a connecting structure 540 having the pad 542 disposed on the first surface of the substrate 510, the side wiring portion 544 disposed on a side surface of the substrate 510, and the contact end 546 disposed on the second surface of the substrate 510 (i.e., the bottom surface of the glass substrate 510 as shown in FIG. 7). The PCB 550 has a transmitter antenna Tx correspondingly disposed facing the glass substrate 510, and a protrusion contact 564 in direct contact with the corresponding contact end 546 of the connecting structure 540. The transmitter antenna Tx corresponds to the receiver antenna Rx in a way that a center line C showing the centers of the transmitter antenna Tx and the receiver antenna Rx to be substantially align with each other. Further, a backlight module 710 is disposed between the glass substrate 510 and the PCB 550. Due to the existence of the backlight module 710, the height of the protrusion contact 564 is increased. Moreover, on top of the structure, the LCD panel 700 has a plurality of layers including, without being limited thereto, a TFT layer 720, a liquid crystal layer 730 and a color filter layer 740. A sealant 735 is provided at a side of the liquid crystal layer 730 for sealing purposes. The details of the TFT layer 720 are not herein elaborated.

Figure 8A:
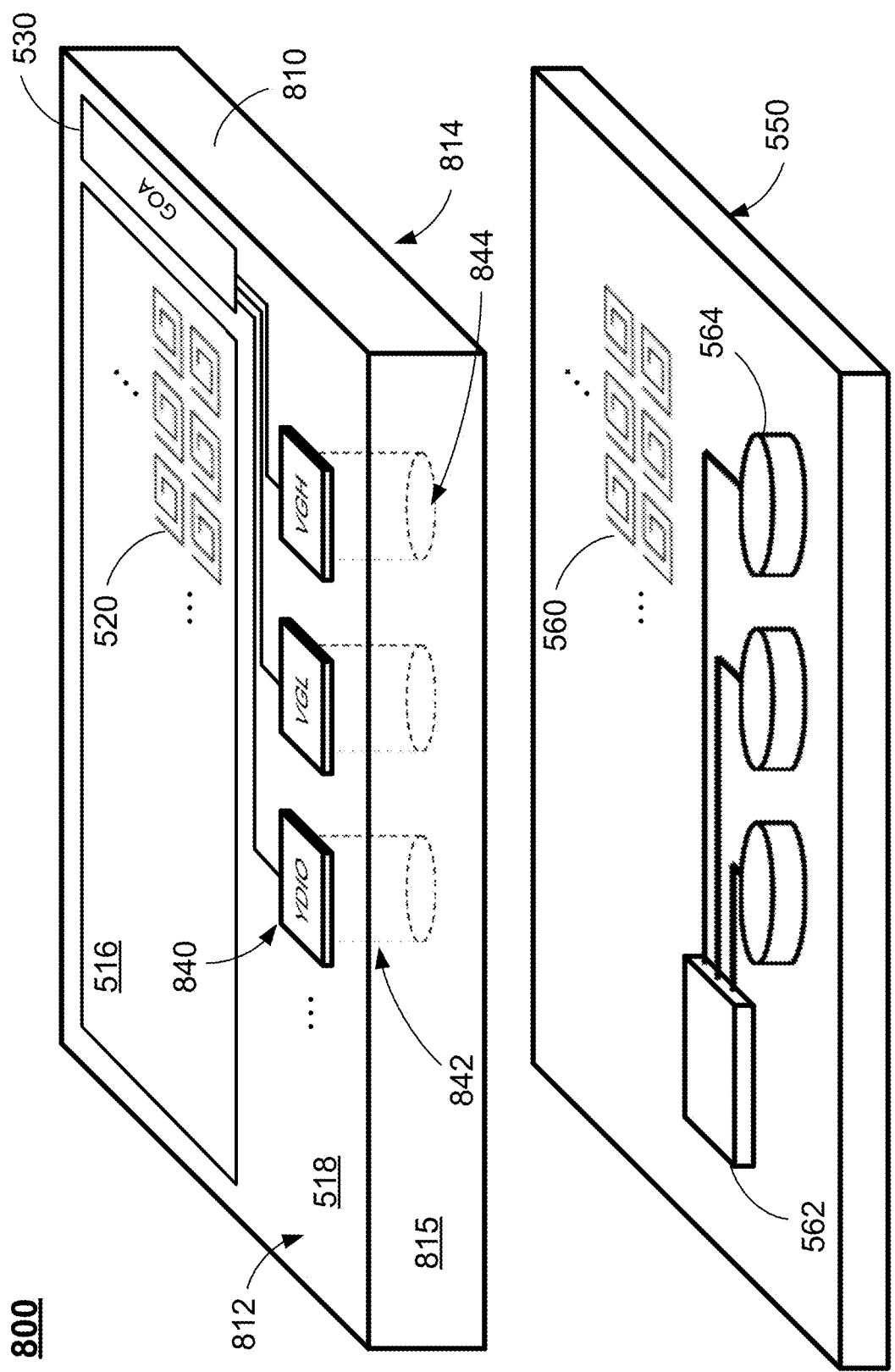
FIG. 8A schematically shows an exploded view of the receiver antenna structure and the transmitter antenna structure of a display panel according to certain embodiments of the present disclosure, where the connecting structures are formed by side wiring.
Figure 8B:
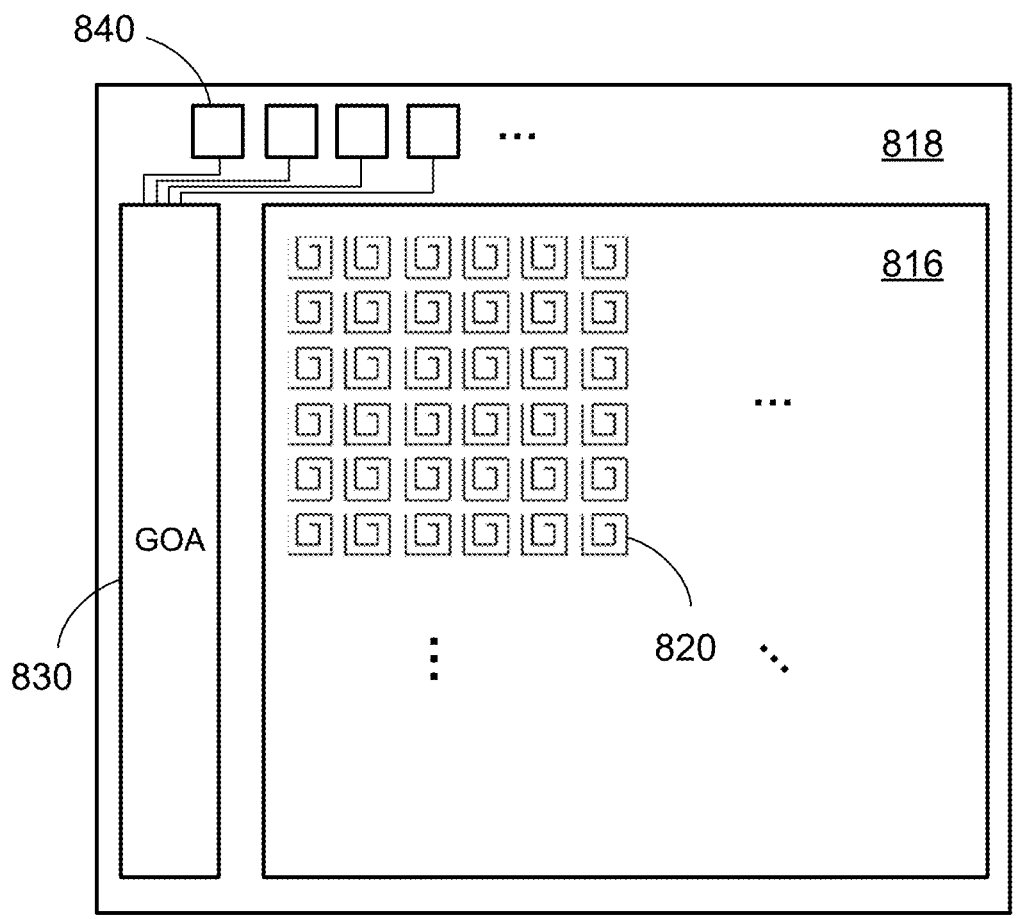
FIG. 8B schematically shows a top view of the receiver antenna structure and the connecting structures as shown in FIG. 8A according to certain embodiments of the present disclosure.

FIG. 8A schematically shows an exploded view of the receiver antenna structure and the transmitter antenna structure of a display panel according to certain embodiments of the present disclosure, and FIG. 8B schematically shows a top view of the receiver antenna structure and the connecting structures as shown in FIG. 8A. As shown in FIG. 8A, the display panel 800 include a glass substrate 810 and a PCB 550 spatially distanced from each other. The glass substrate 810 has a first surface 812 (i.e., the top surface as shown in FIG. 8A), a second surface 814 (i.e., the bottom surface facing the PCB 550 as shown in FIG. 8A), and a side surface 815 (i.e., the front surface as shown in FIG. 8A). The PCB 550 and the components on the PCB 550 are all identical to the components with the same reference numbers as shown in FIG. 5A, and are thus not elaborated herein. Specifically, the only difference between the components on the glass substrate 810 as shown in FIGS. 8A and 8B and the corresponding components as shown in FIGS. 5A and 5B exists in the connecting structures 840. Other components on the glass substrate 810 are identical to the components with the same reference numbers as shown in FIGS. 5A and 5B, and are thus not elaborated herein.

As shown in FIG. 8A, each of the connecting structures 840 are provided to be electrically connected to the GOA 530 to facilitate transmission of signals for the GOA 530. Specifically, each connecting structure 840 has a corresponding through hole 842, which can be a through glass via (TGV) penetrating through the glass substrate 810, and a conductive material is filled in the TGV 842 to form the connecting structure 840. Thus, the connecting structure 840 has a contact end 844 exposed on the second surface 814 from the TGV 842, and the contact end 844 may be in direct contact with the protrusion contact 564, such that the control driver 562 on the PCB may transmit the scan signals to the GOA 530 through the protrusion contacts 564 and the connecting structures 840. In this case, no side wiring is required for the connecting structures 840.

Figure 9:
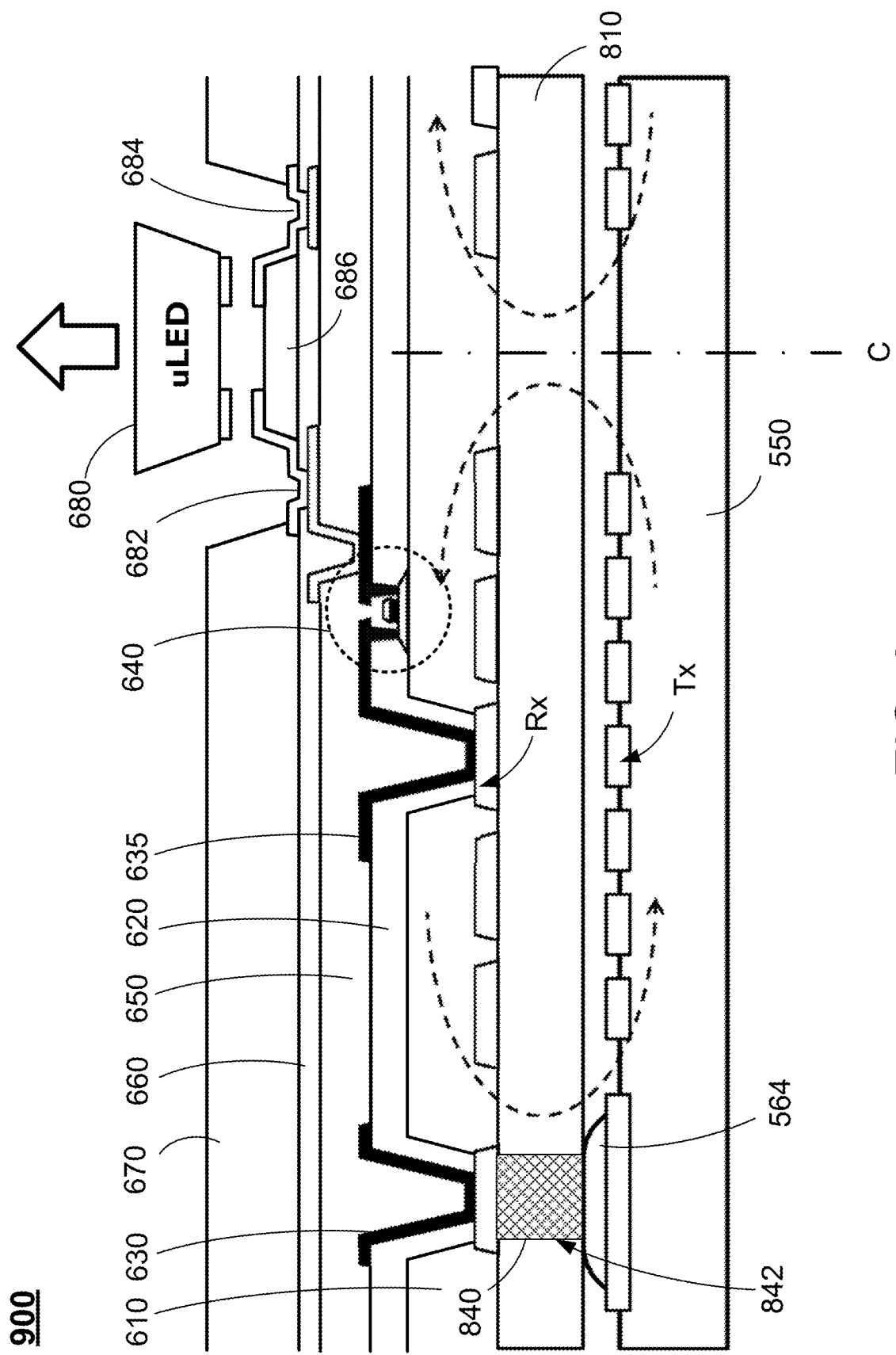
FIG. 9 schematically shows a sectional view of a LED display panel having the structure as shown in FIG. 8A according to certain embodiments of the present disclosure.

FIG. 9 schematically shows a sectional view of a LED display panel having the structure as shown in FIG. 8A according to certain embodiments of the present disclosure. As shown in FIG. 9, the display panel 900 is a micro LED display, which has the structure as shown in FIG. 8A. Specifically, the only difference between the structures of the display panel 900 and the display panel 600 as shown in FIG. 6 exists in the connecting structure 840, which is formed by the conductive structure filled in the through hole 842. Other structures, components and layers of the display panel 900 are identical to the corresponding structures, components and layers with the same reference numbers as shown in FIG. 6, and are thus not elaborated herein.

Figure 10:
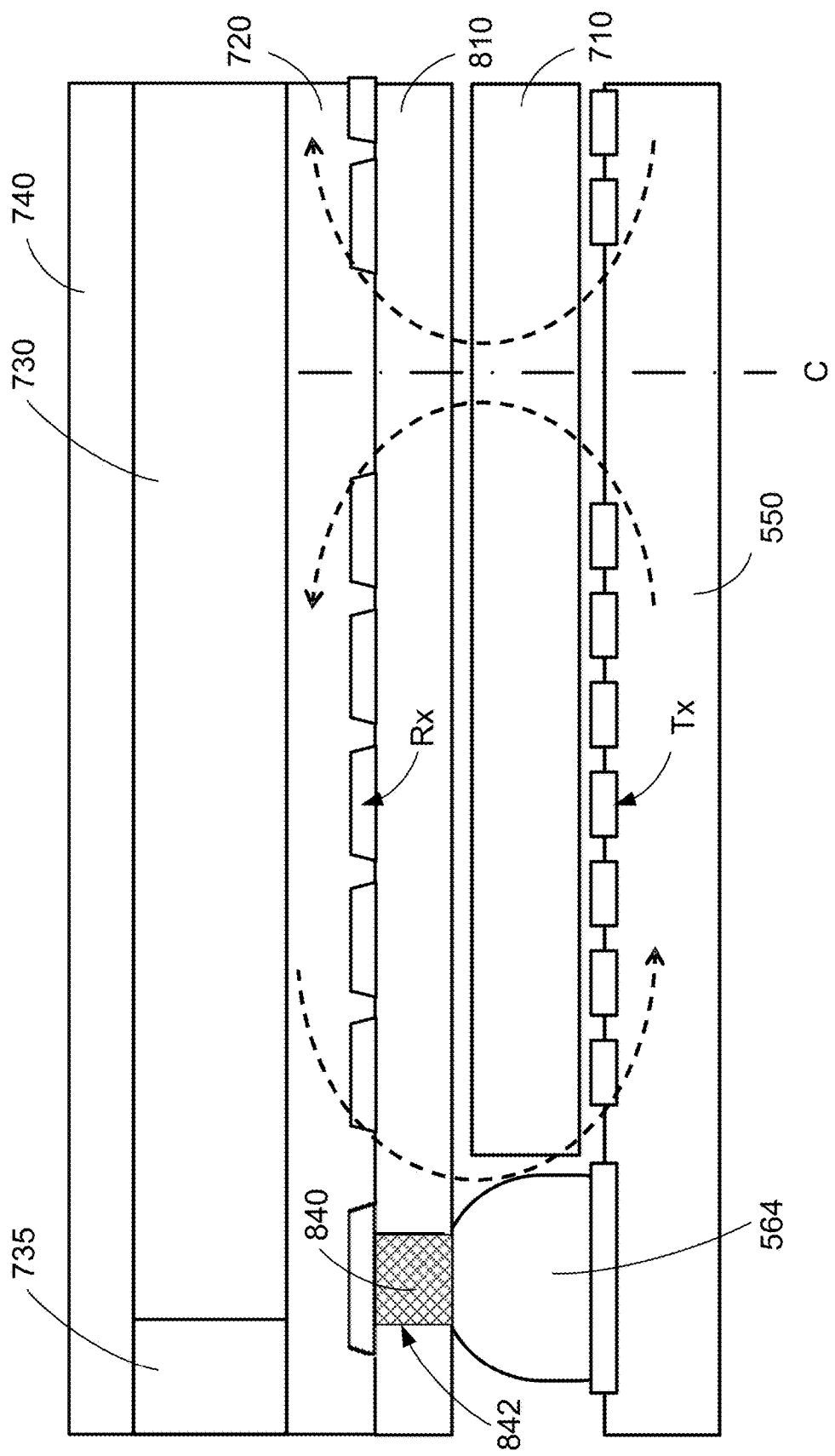
FIG. 10 schematically shows a sectional view of a LCD panel having the structure as shown in FIG. 8A according to certain embodiments of the present disclosure.

FIG. 10 schematically shows a sectional view of a LCD panel having the structure as shown in FIG. 8A according to certain embodiments of the present disclosure. As shown in FIG. 10, the display panel 1000 is a LCD panel, which has the structure as shown in FIG. 8A. Specifically, the only difference between the structures of the display panel 1000 and the display panel 700 as shown in FIG. 7 exists in the connecting structure 840, which is formed by the conductive structure filled in the through hole 842. Other structures, components and layers of the display panel 1000 are identical to the corresponding structures, components and layers with the same reference numbers as shown in FIG. 7, and are thus not elaborated herein.

Figure 11A:
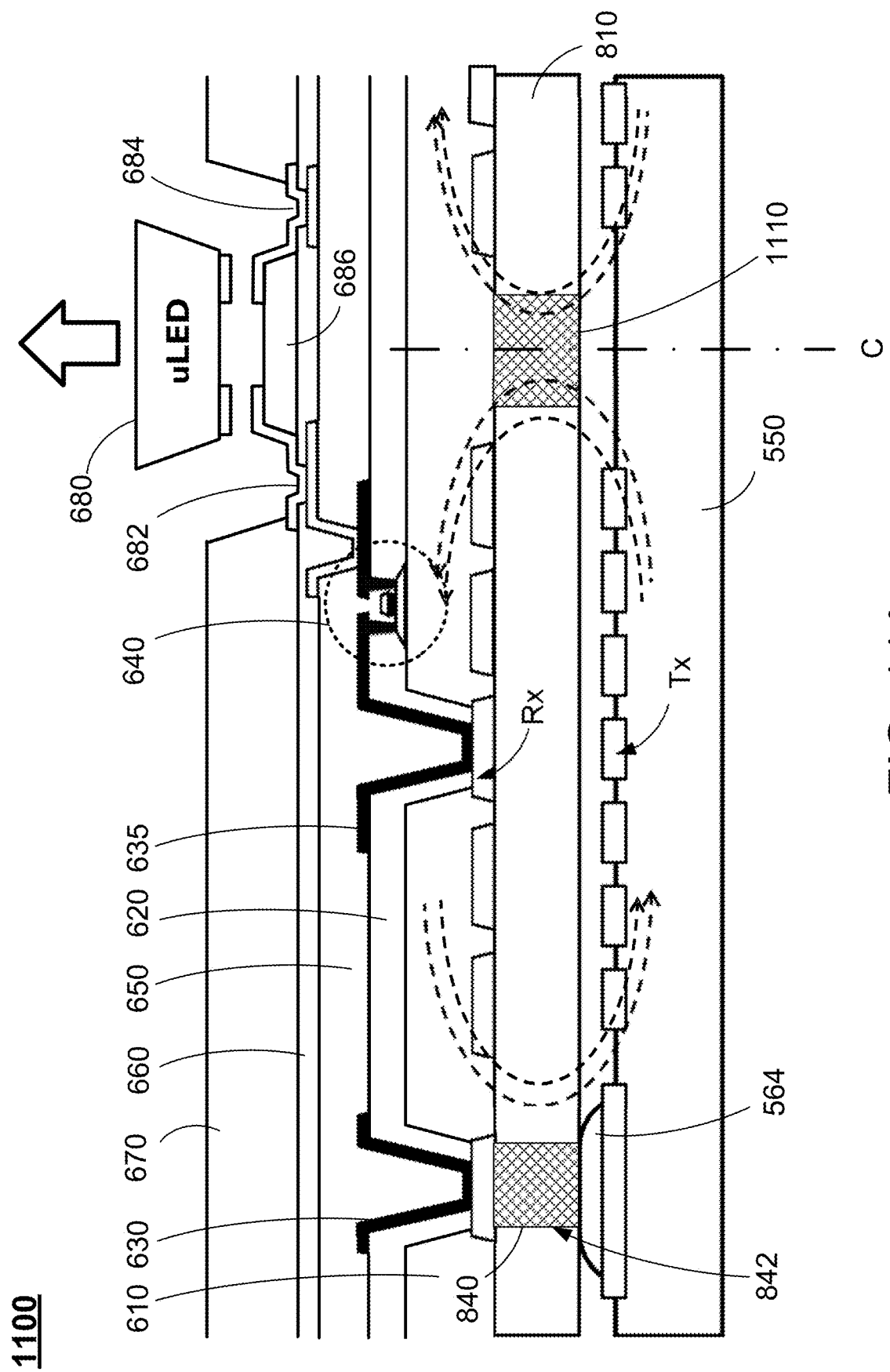
FIG. 11A schematically shows a sectional view of a LED display panel according to certain embodiments of the present disclosure, where a ferrite structure is filled in a corresponding through hole on the substrate.
Figure 11B:
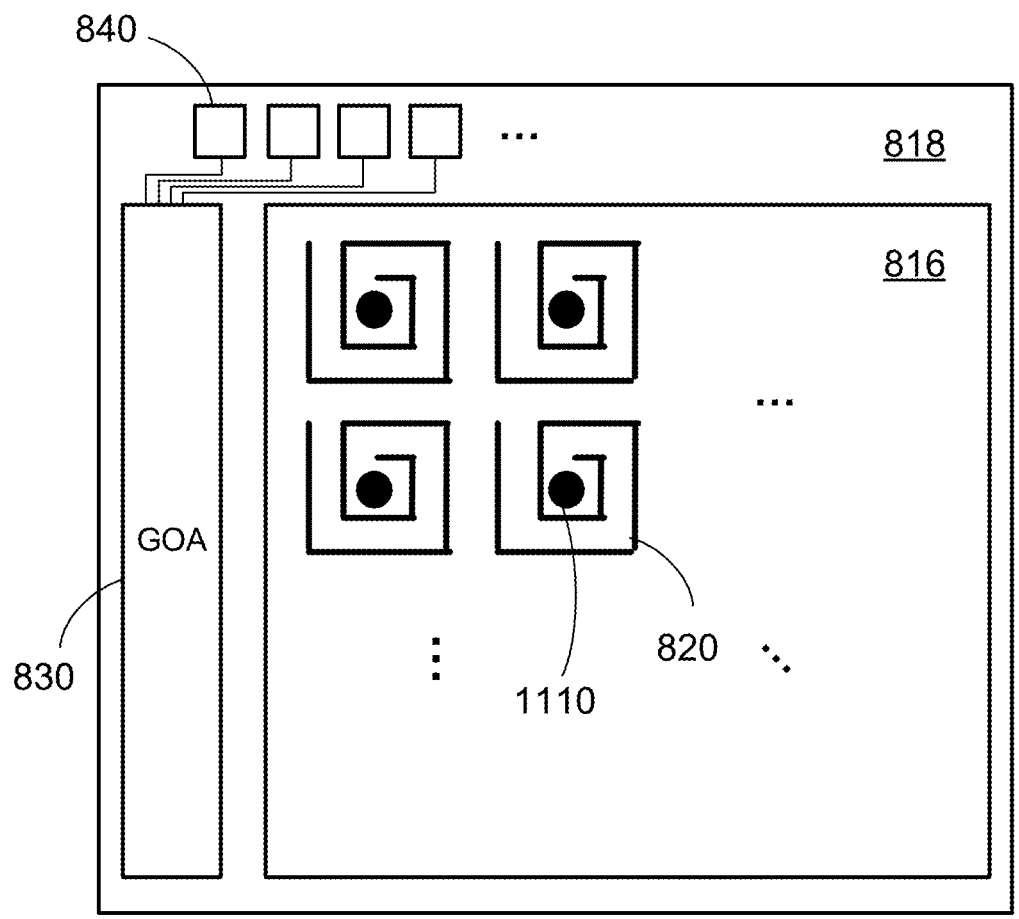
FIG. 11B schematically shows a top view of the receiver antenna structure and the ferrite structure as shown in FIG. 11A according to certain embodiments of the present disclosure.

In certain embodiments, to enhance the transmission efficiency of the receiver antennas in the receiver antenna structure, the receiver antenna structure may be provided with additional ferrite structures. For example, FIG. 11A schematically shows a sectional view of a LED display panel according to certain embodiments of the present disclosure, where a ferrite structure is filled in a corresponding through hole on the substrate, and FIG. 11B schematically shows a top view of the structure as shown in FIG. 11A. Specifically, as shown in FIG. 11A, the display panel 1100 is a micro LED display, which has a similar structure to the display panel 900 as shown in FIG. 9. The only difference between the structures of the display panel 1100 as shown in FIG. 11A and the display panel 900 as shown in FIG. 9 exists in that a ferrite structure 1110 is provided to be align with the center of the receiver antenna Rx. Other structures, components and layers of the display panel 1100 are identical to the corresponding structures, components and layers with the same reference numbers as shown in FIG. 9, and are thus not elaborated herein.

Specifically, as shown in FIGS. 11A and 11B, each receiver antenna Rx has a corresponding hole formed on the glass substrate 810, and the corresponding hole aligns with the center of the corresponding receiver antenna Rx. The ferrite structure 1110 is filled in a corresponding hole on the glass substrate 810, such that the ferrite structure 1110 may enhance the magnetic induction between the receiver antenna Rx and the corresponding transmitter antenna Tx, thus enhancing the transmission efficiency thereof.

Figure 11C:
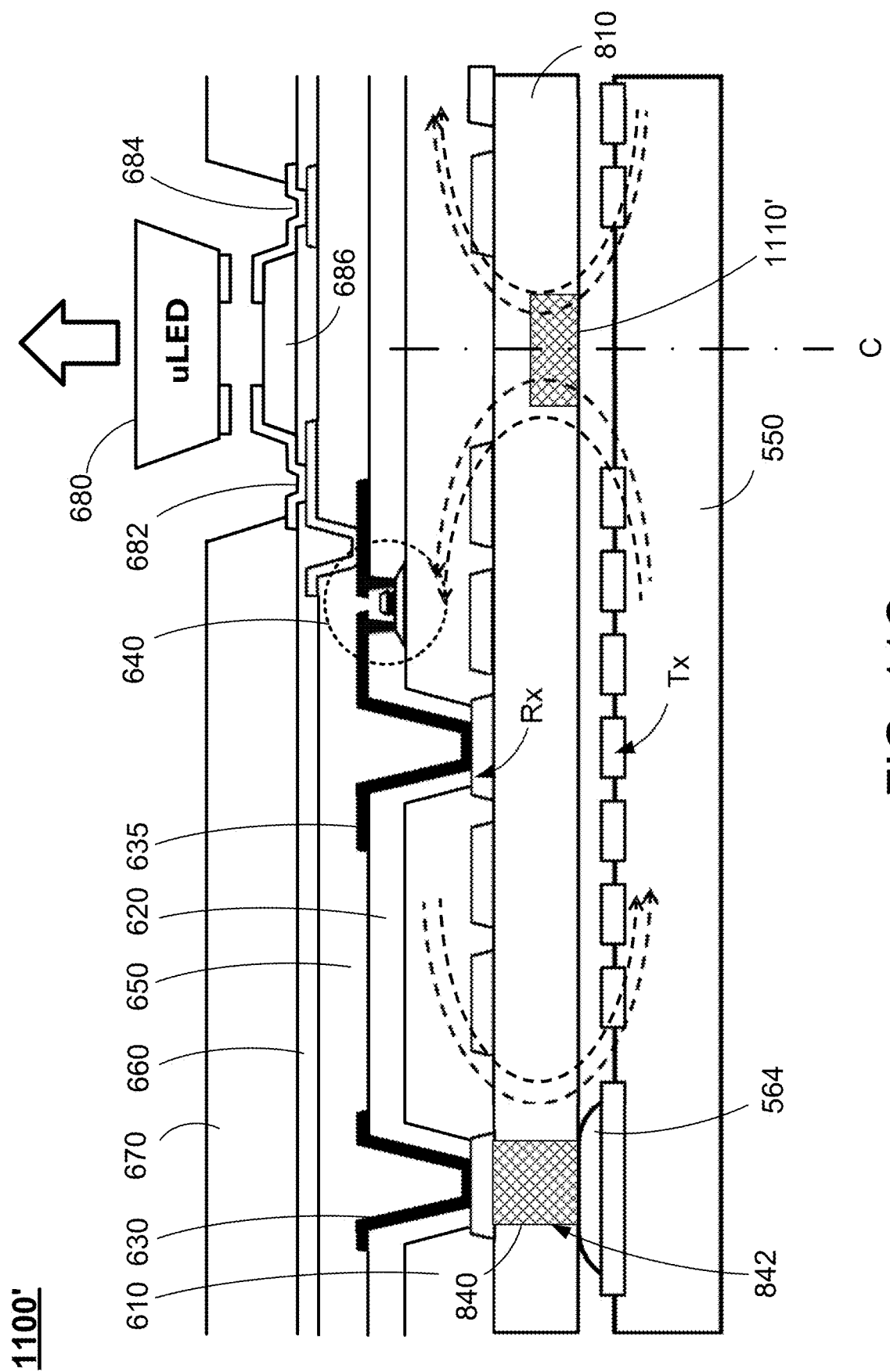
FIG. 11C schematically shows a sectional view of a LED display panel according to certain embodiments of the present disclosure, where a ferrite structure is filled in a corresponding blind hole on the substrate.

As shown in FIG. 11A, the corresponding hole is a through hole, which can be a TGV penetrating through the glass substrate 810 along a vertical direction perpendicular to the substrate 810. However, in certain embodiments, the corresponding hole may be a blind hole. For example, FIG. 11C schematically shows a sectional view of a LED display panel according to certain embodiments of the present disclosure. The only difference between the structures of the display panel 1100' as shown in FIG. 11C and the display panel 1100 as shown in FIG. 11A exists in that, as shown in FIG. 11C, the ferrite structure 1110' is filled in a corresponding blind hole formed on the second surface of the glass substrate 810 facing the PCB 550, without penetrating throughout the glass substrate 810. Other structures, components and layers of the display panel 1100' are identical to the corresponding structures, components and layers with the same reference numbers as shown in FIG. 11A, and are thus not elaborated herein.

It should be noted that each of the connecting structures as shown in FIGS. 11A, 11B and 11C is identical to the corresponding connecting structure 840 as shown in FIGS. 8A, 8B and 9, which is in the form of a conductive structure filled in the through hole 842. In other embodiments, the connecting structures as shown in FIGS. 11A to 11C may be replaced by other connecting structures, such as the connecting structures 540 as shown in FIGS. 5A, 5B and 6.

Further, each of the display panels as shown in FIGS. 11A and 11C is a micro LED display panel. In certain embodiments, the ferrite structure 1110 as shown in FIG. 11A or the ferrite structure 1110' as shown in FIG. 11C may also be applied to a LCD panel, such as the LCD panel as shown in FIG. 10.

In the embodiments as discussed above, the receiver antenna structure is disposed on the first surface of the glass substrate, and the transmitter antenna structure is disposed to face the second surface of the glass substrate, such that the glass substrate is located between the receiver antenna structure and the transmitter antenna structure. In other words, the receiver antenna structure and the transmitter antenna structure are disposed at different sides of the glass substrate. In certain embodiments, the receiver antenna structure and the transmitter antenna structure may be disposed on the same side of the glass substrate facing each other, such that the distance between the receiver antenna structure and the transmitter antenna structure may be reduced, thus enhancing the transmission efficiency thereof.

Figure 12:
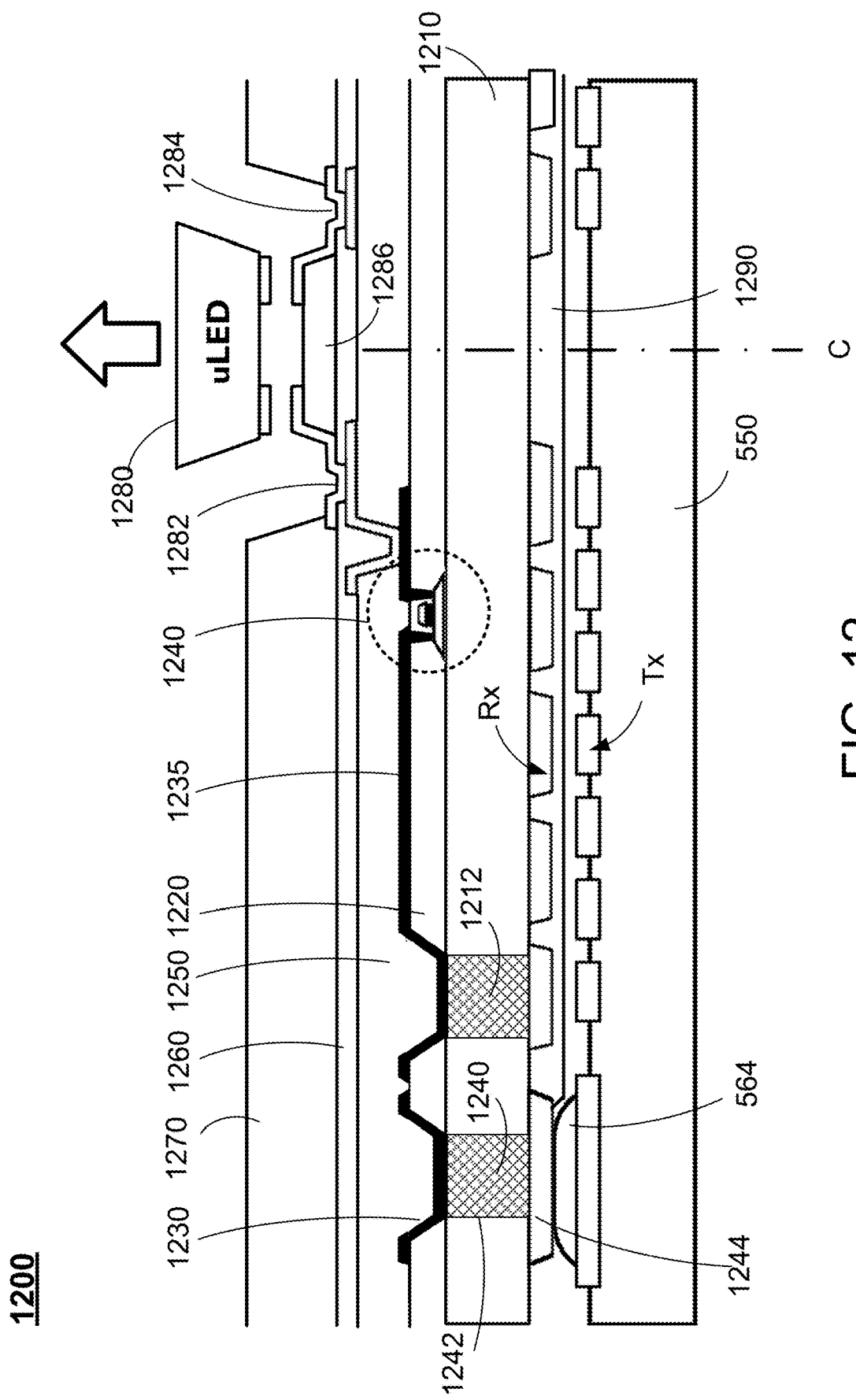
FIG. 12 schematically shows a sectional view of a LED display panel according to certain embodiments of the present disclosure, where the receiver antenna structure is disposed on a second surface of the glass substrate facing the transmitter antenna structure.

FIG. 12 schematically shows a sectional view of a LED display panel according to certain embodiments of the present disclosure, where the receiver antenna structure is disposed on a second surface of the glass substrate facing the transmitter antenna structure. As shown in FIG. 12, the display panel 1200 is a micro LED display, where the PCB 550 and the components on the PCB 550, such as the transmitter antenna Tx and the protrusion contact 564, are identical to the corresponding structures with the same reference numbers as shown in FIGS. 6 and 9, and are thus not elaborated herein. As shown in FIG. 12, the glass substrate 1210 has a receiver antenna Rx disposed on the second surface thereof (i.e., the bottom surface of the glass substrate 1210 as shown in FIG. 12), and a connecting structure 1240, which is formed by a conductive structure filled in a through hole 1242, and a pad 1244 disposed on the second surface of the substrate 1210, such that the pad 1244 functions as a contact end to be in direct contact with the protrusion contact 564. In addition, the receiver antenna Rx has a corresponding through hole 1212, which can be a TGV penetrating through the glass substrate 1210, and a conductive material is filled in the TGV 1212 to form a conductive structure connecting the receiver antenna Rx to the first surface of the substrate 1210. Further, on top of the structure, the LED display panel 1200 has a plurality of layers including, without being limited thereto, an ILD layer 1220, a flatten layer 1250, a first insulating layer 1260, and a BM layer 1270. Further, a micro LED chip 1280 is disposed on the insulating layer 1260 for emitting light. The micro LED chip 1280 has an anode 1282 and a cathode 1284, and a bump 1286 is disposed below the micro LED chip 1280. A connecting wire 1230 is formed between the ILD layer 1220 and the flatten layer 1250 to electrically connect the connecting structure 1240 to the GOA (not shown in FIG. 12). Further, a data line 1235 is formed between the ILD layer 1220 and the flatten layer 1250 to electrically connect the conductive structure formed in the TGV 1212 (which is connected to the receiver antenna Rx) to the source electrode of the thin-film transistor 1240. In certain embodiments, the connecting wire 1230 and the data line 1235 are formed as the same conductive layer. The drain electrode of the thin-film transistor 1240 is electrically connected to the anode 1282 of the micro LED chip 1280. Moreover, a second insulating layer 1290 is formed on the second surface of the glass substrate 1210 to cover the receiver antenna Rx.

As shown in FIG. 12, the connecting structure 1240 is a conductive structure formed in a corresponding TGV 1242, which is similar to the corresponding connecting structures 840 as shown in FIGS. 8A, 8B and 9. In other embodiments, the connecting structure as shown in FIG. 12 may be replaced by other connecting structures, such as the connecting structures 540 as shown in FIGS. 5A, 5B and 6.

Figure 13:
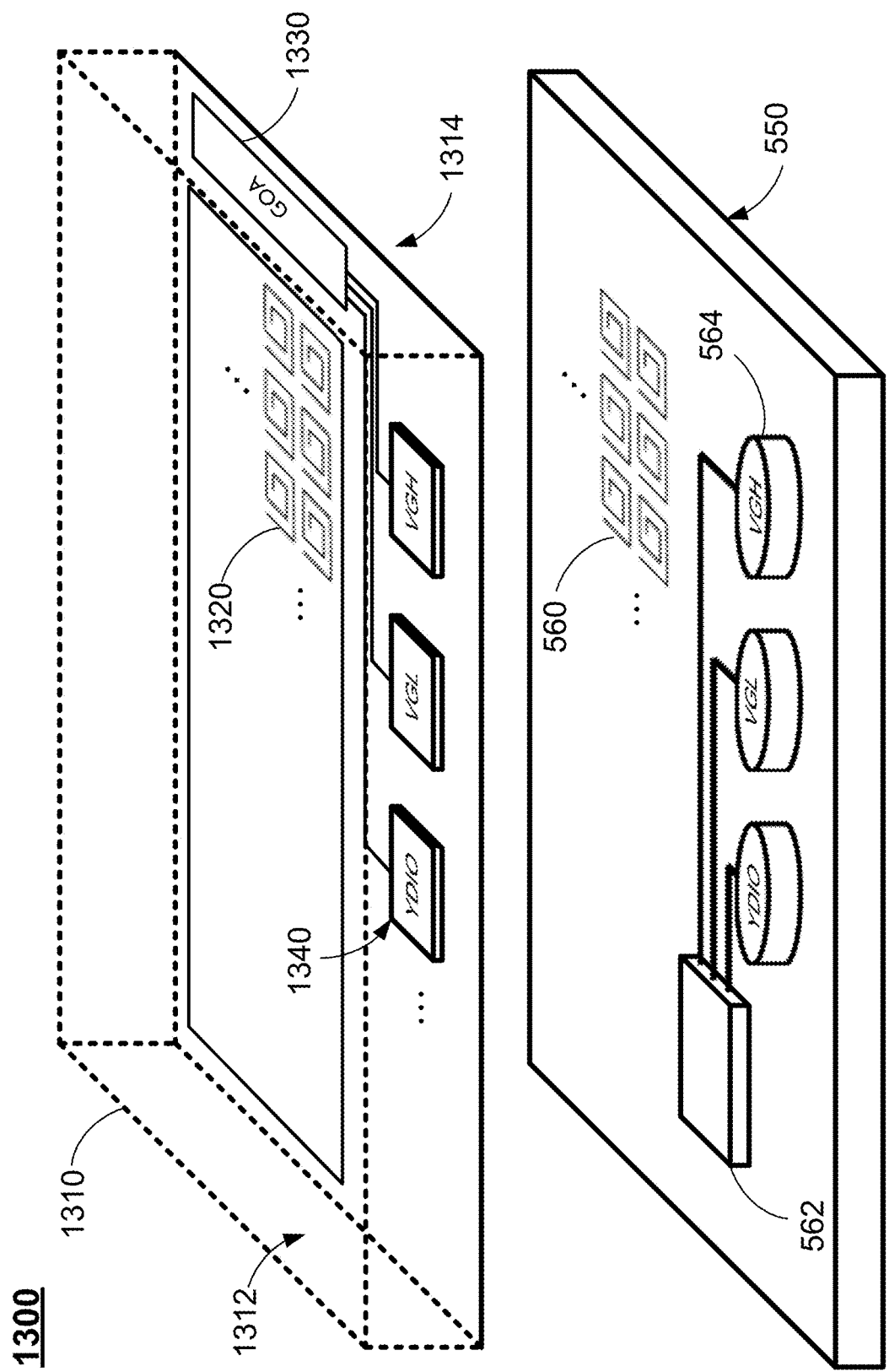
FIG. 13 schematically shows an exploded view of the receiver antenna structure and the transmitter antenna structure of a display panel according to certain embodiments of the present disclosure, where the receiver antenna structure, the GOA and the connecting structures are formed on the second surface of the glass substrate.

As shown in FIG. 12, most of the components, structures and layers of the pixel structure still remain on the first surface side of the glass substrate 1210. In certain embodiments, the whole pixel structure, the GOA and the connecting structures may all be moved to the second surface to face the PCB, thus forming a flip cell structure. For example, FIG. 13 schematically shows an exploded view of the receiver antenna structure and the transmitter antenna structure of a display panel according to certain embodiments of the present disclosure. As shown in FIG. 13, the display panel 1300 includes a glass substrate 1310 and a PCB 550 spatially distanced from each other. The PCB 550 and the components on the PCB 550, such as the transmitter antenna 560, the control driver 562 and the protrusion contacts 564, are identical to the corresponding structures with the same reference numbers as shown in FIG. 5A, and are thus not elaborated herein. The glass substrate 1310 has a first surface 1312 (i.e., the top surface as shown in FIG. 13) and a second surface 1314 (i.e., the bottom surface facing the PCB 550 as shown in FIG. 13). The receiver antenna structure 1320, the GOA 1330 and the connecting structures 1340 are all formed on the second surface 1314 of the glass substrate 1310. In this case, there is no need to form side wiring or through holes on the glass substrate 1310.

Figure 14:
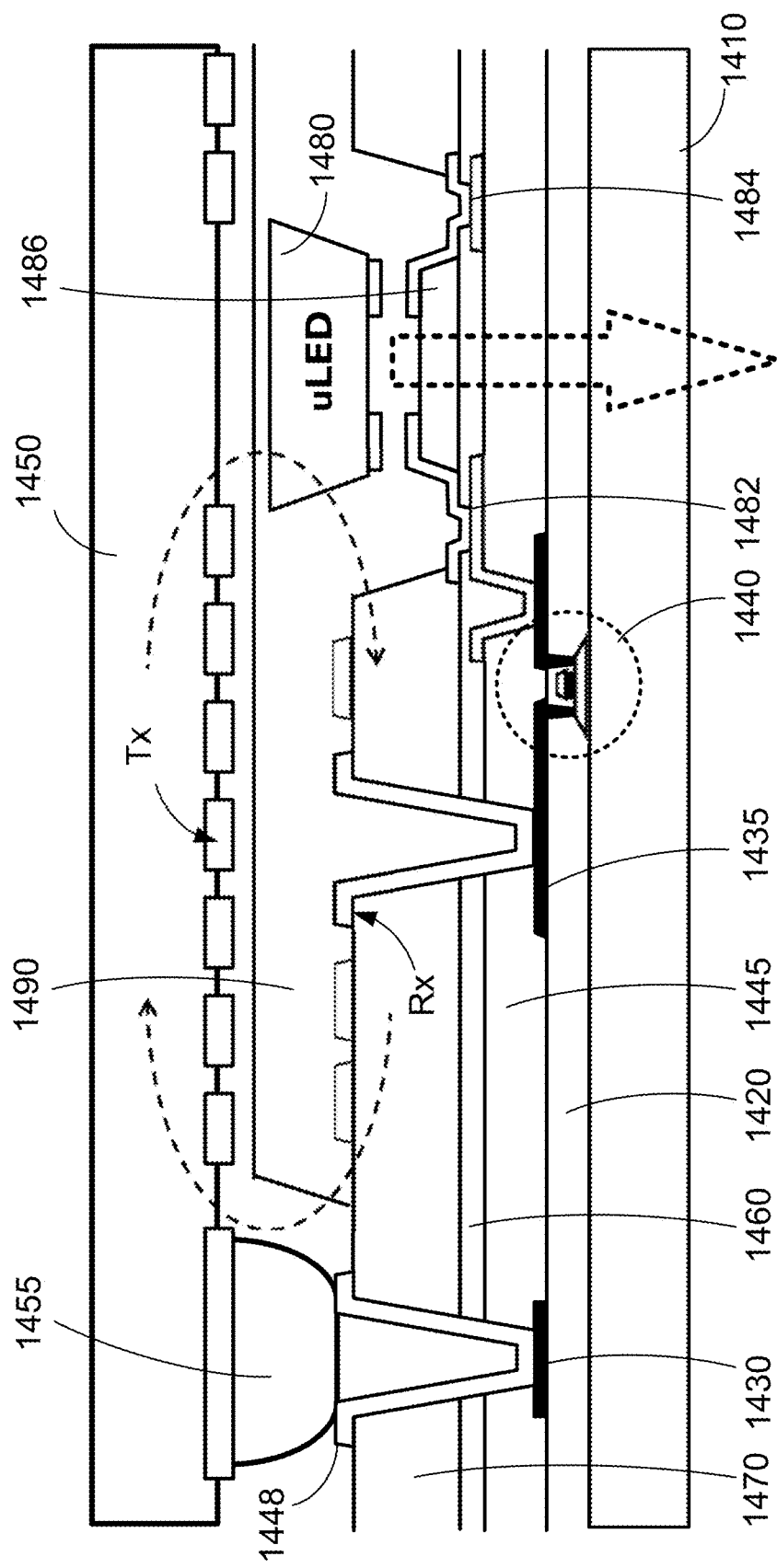
FIG. 14 schematically shows a sectional view of a LED display panel having the structure as shown in FIG. 13 according to certain embodiments of the present disclosure.

FIG. 14 schematically shows a sectional view of a LED display panel having the structure as shown in FIG. 13 according to certain embodiments of the present disclosure. As shown in FIG. 14, the display panel 1400 is a micro LED display, which has the structure as shown in FIG. 13. Specifically, in the display panel 1400 as shown in FIG. 14, the PCB 1450 is on the top side and the glass substrate 1410 is on the bottom side of FIG. 14. In this case, the first surface of the glass substrate 1410 is the bottom surface of the glass substrate 1410, and the second surface of the glass substrate 1410 is the top surface of the glass substrate 1410. The PCB 1450 has a transmitter antenna Tx correspondingly disposed facing the glass substrate 1410, and a protrusion contact 1455. The transmitter antenna Tx corresponds to the receiver antenna Rx in a way that a center line C showing the centers of the transmitter antenna Tx and the receiver antenna Rx to be substantially align with each other. On the second surface of the glass substrate 1410, a plurality of layers are formed, including, without being limited thereto, an ILD layer 1420, a flatten layer 1445, an insulating layer 1660, and a BM layer 1470, and an encapsulation layer 1490. A micro LED chip 1480 is disposed on the insulating layer 1460 for emitting light. The micro LED chip 1480 has an anode 1482 and a cathode 1484, and a bump 1486 is disposed below the micro LED chip 1480. It should be noted that, since the micro LED chip 1480 emits light downward, the bump 1486 should be transparent to allow the light to penetrate therethrough. A connecting wire 1430 is formed between the ILD layer 620 and the flatten layer 1445, and a connecting structure 1448 is provided on the BM layer 1470 through a via to be electrically connected to the connecting wire 1430, such that the connecting wire 1430 electrically connect the connecting structure 1448 to the GOA (not shown in FIG. 14). Further, a data line 1435 is formed between the ILD layer 1420 and the flatten layer 1450, and the receiver antenna Rx is formed on the BM layer 1470. One segment of the receiver antenna Rx is formed through a via to be electrically connected to the data line 1435, such that the data line 1435 electrically connects the receiver antenna Rx to the source electrode of the thin-film transistor 1440. In certain embodiments, the connecting wire 1430 and the data line 1435 are formed as the same conductive layer. The drain electrode of the thin-film transistor 1440 is electrically connected to the anode 1482 of the micro LED chip 1480. It should be noted that the glass substrate 1410 as shown in FIG. 14 does not have any side wiring or through holes thereon, thus simplifying the manufacturing process and cost of the display panel 1400.

Figure 15:
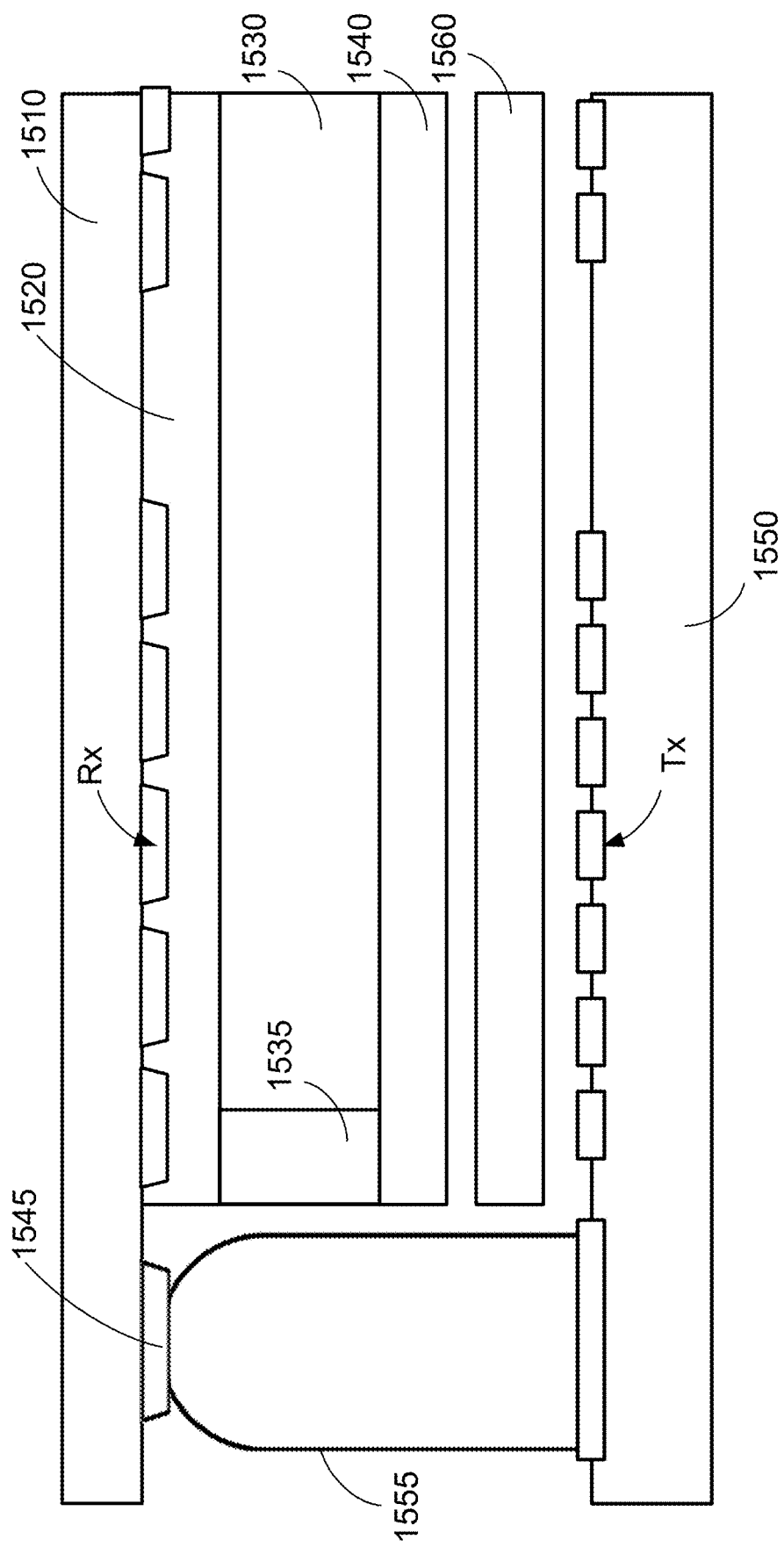
FIG. 15 schematically shows a sectional view of a LCD panel having the structure as shown in FIG. 13 according to certain embodiments of the present disclosure.

FIG. 15 schematically shows a sectional view of a LCD panel having the structure as shown in FIG. 13 according to certain embodiments of the present disclosure. As shown in FIG. 15, the display panel 1500 is a LCD panel, which has the structure as shown in FIG. 13. Specifically, in the display panel 1500 as shown in FIG. 15, the PCB 1550 is on the bottom side and the glass substrate 1510 is on the bottom side of FIG. 15. In this case, the first surface of the glass substrate 1510 is the top surface of the glass substrate 1510, and the second surface of the glass substrate 1510 is the bottom surface of the glass substrate 1510. Specifically, the glass substrate 1510 has a receiver antenna Rx disposed on the second surface thereof (i.e., the bottom surface of the glass substrate 1510 as shown in FIG. 15), and a connecting structure 1545 disposed on the second surface of the substrate 1510 (i.e., the bottom surface of the glass substrate 1510 as shown in FIG. 15). The PCB 1550 has a transmitter antenna Tx correspondingly disposed facing the glass substrate 1510, and a protrusion contact 1555 in direct contact with the corresponding contact end of the connecting structure 1545. The transmitter antenna Tx corresponds to the receiver antenna Rx in a way that a center line C showing the centers of the transmitter antenna Tx and the receiver antenna Rx to be substantially align with each other. Further, a backlight module 1560 is disposed between the glass substrate 1510 and the PCB 1550. Due to the existence of the backlight module 1560, the height of the protrusion contact 1555 is increased. Moreover, on the second surface of the glass substrate 1510, the LCD panel 1500 has a plurality of layers including, without being limited thereto, a TFT layer 1520, a liquid crystal layer 1530 and a color filter layer 1540. A sealant 1535 is provided at a side of the liquid crystal layer 1530 for sealing purposes. The details of the TFT layer 1520 are not herein elaborated.

Figure 16:
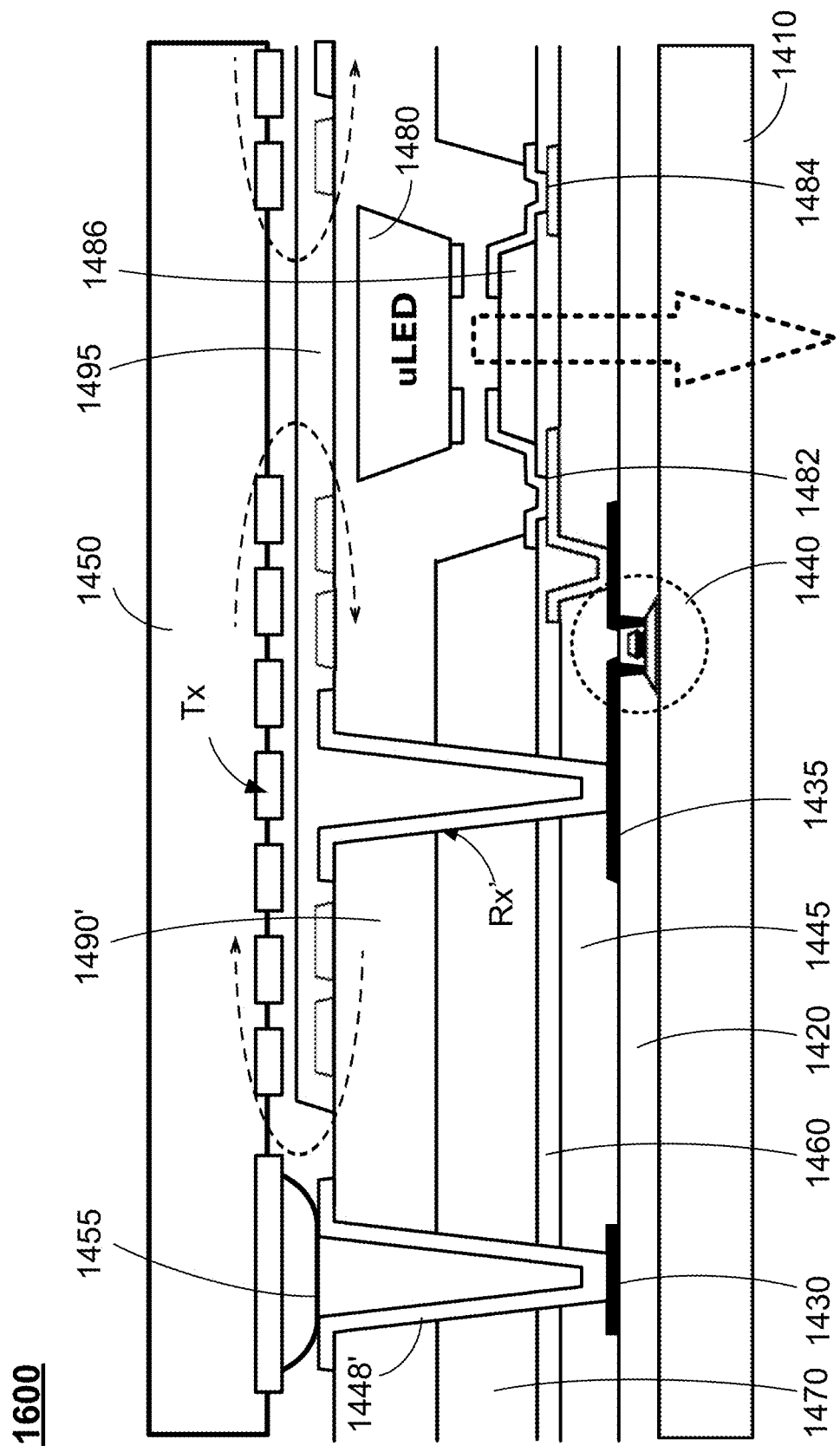
FIG. 16 schematically shows a sectional view of a LED display panel having the structure as shown in FIG. 13 according to certain embodiments of the present disclosure.

FIG. 16 schematically shows a sectional view of a LED display panel having the structure as shown in FIG. 13 according to certain embodiments of the present disclosure. As shown in FIG. 16, the display panel 1600 is a micro LED display, which has the structure as shown in FIG. 13. Specifically, the only difference between the structures of the display panel 1600 and the display panel 1400 as shown in FIG. 14 exists in that the receiver antenna Rx' and the connecting structure 1448' are formed on the encapsulation layer 1490' instead of the BM layer 1470. In this case, an additional insulating layer 1495 may be provided to cover the receiver antenna Rx'. Other structures, components and layers of the display panel 1600 are identical to the corresponding structures, components and layers with the same reference numbers as shown in FIG. 14, and are thus not elaborated herein.

The embodiments of the antennas as described above may be used in different types of wireless display panels and/or display apparatuses. Further, The embodiments as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
    a substrate defining a display area thereon, and having a first surface and a second surface opposite to each other;
    a pixel structure disposed on the first surface of the substrate and corresponding to the display area, the pixel structure comprising a plurality of pixels arranged in an array;
    a receiver antenna structure disposed on the substrate and corresponding to the pixel structure, configured to provide data signals to the pixels, wherein the receiver antenna structure comprises a plurality of receiver antennas; and
    a transmitter antenna structure facing the second surface of the substrate and spatially separated from the receiver antenna structure, configured to transmit wireless signals to the receiver antenna structure, wherein the transmitter antenna structure comprises a plurality of transmitter antennas one-to-one corresponding to the receiver antennas;
    wherein each of the receiver antennas corresponds to a corresponding hole formed on the substrate.

2. The display panel of claim 1, wherein the receiver antenna structure is disposed on the first surface of the substrate, and the transmitter antenna structure is disposed to face the second surface of the substrate, such that the substrate is located between the receiver antenna structure and the transmitter antenna structure.

3. The display panel of claim 2, wherein the corresponding hole to each of the receiver antennas is formed to align with a center of each of the receiver antennas along a vertical direction perpendicular to the substrate, and a ferrite structure is filled in the corresponding hole.

4. The display panel of claim 3, wherein the corresponding hole to each of the receiver antennas is a through hole penetrating through the first surface and the second surface of the substrate.

5. The display panel of claim 1, wherein the receiver antenna structure is disposed on the second surface of the substrate facing the transmitter antenna structure.

6. The display panel of claim 5, wherein the corresponding hole to each of the receiver antennas is a through hole penetrating through the first surface and the second surface of the substrate, and a feeding end of each of the receiver antennas is electrically connected to a plurality of corresponding pixels of the pixels through a conductive structure filled in the corresponding hole.

7. The display panel of claim 1, further comprising:
    a gate driver disposed in a peripheral area on the first surface of the substrate;
    a plurality of connecting structures disposed in the peripheral area of the substrate and electrically connected to the gate driver;
    a printed circuit board (PCB) disposed to be spatially separated from the substrate and facing the second surface of the substrate, wherein the transmitter antenna structure is disposed on the PCB;
    a control driver disposed on the PCB, configured to generate a plurality of scan signals for the gate driver; and
    a plurality of protrusion contacts convexly disposed on the PCB and electrically connected to the control driver;
    wherein each of the connecting structures corresponds to one of the protrusion contacts, and each of the connecting structures has a contact end disposed on the second surface of the substrate to be in direct contact with a corresponding one of the protrusion contacts, such that the control driver transmits the scan signals to the gate driver through the protrusion contacts and the connecting structures.

8. The display panel of claim 7, wherein each of the connector structures has a side wiring portion disposed on a side surface of the substrate, and the contact end of each of the connector structures is electrically connected to the gate driver on the first surface of the substrate through the side wiring portion.

9. The display panel of claim 7, wherein each of the connector structures is filled in a corresponding through hole penetrating through the first surface and the second surface of the substrate, and the contact end of each of the connector structures is exposed on the second surface of the substrate from the corresponding through hole.

10. The display panel of claim 1, being a light emitting diode (LED) display panel, wherein each of the pixels comprises a LED disposed on the first side of the substrate.

11. The display panel of claim 1, being a liquid crystal display (LCD) panel, and further comprising a backlight module disposed between the receiver antenna structure and the transmitter antenna structure.

12. A display panel, comprising:
a substrate defining a display area thereon, and having a first surface and a second surface opposite to each other;
a pixel structure disposed on the substrate and corresponding to the display area, the pixel structure comprising a plurality of pixels arranged in an array;
a receiver antenna structure disposed on the second surface of the substrate and corresponding to the pixel structure, configured to provide data signals to the pixels, wherein the receiver antenna structure comprises a plurality of receiver antennas; and
a transmitter antenna structure facing the second surface of the substrate and spatially separated from the receiver antenna structure, configured to transmit wireless signals to the receiver antenna structure, wherein the transmitter antenna structure comprises a plurality of transmitter antennas one-to-one corresponding to the receiver antennas.

13. The display panel of claim 12, wherein the pixel structure is disposed on the first surface of the substrate, each of the receiver antennas corresponds to a corresponding through hole penetrating through the first surface and the second surface of the substrate, and a feeding end of each of the receiver antennas is electrically connected to a plurality of corresponding pixels of the pixels through a conductive structure filled in the corresponding through hole.

14. The display panel of claim 13, further comprising:
a gate driver disposed in a peripheral area on the first surface of the substrate;
a plurality of connecting structures disposed in the peripheral area of the substrate and electrically connected to the gate driver;
a printed circuit board (PCB) disposed to be spatially separated from the substrate and facing the second surface of the substrate, wherein the transmitter antenna structure is disposed on the PCB;
a control driver disposed on the PCB, configured to generate a plurality of scan signals for the gate driver; and
a plurality of protrusion contacts convexly disposed on the PCB and electrically connected to the control driver;
wherein each of the connecting structures corresponds to one of the protrusion contacts, and each of the connecting structures has a contact end disposed on the second surface of the substrate to be in direct contact with a corresponding one of the protrusion contacts, such that the control driver transmits the scan signals to the gate driver through the protrusion contacts and the connecting structures.

15. The display panel of claim 14, wherein each of the connector structures has a side wiring portion disposed on a side surface of the substrate, and the contact end of each of the connector structures is electrically connected to the gate driver on the first surface of the substrate through the side wiring portion.

16. The display panel of claim 14, wherein each of the connector structures is filled in a corresponding through hole penetrating through the first surface and the second surface of the substrate, and the contact end of each of the connector structures is exposed on the second surface of the substrate from the corresponding through hole.

17. The display panel of claim 12, wherein the pixel structure is disposed on the second surface of the substrate, and the receiver antenna structure is located between the pixel structure and the transmitter antenna structure.

18. The display panel of claim 17, further comprising:
a gate driver disposed in a peripheral area on the second surface of the substrate;
a plurality of connecting structures disposed in the peripheral area on the second surface of the substrate and electrically connected to the gate driver;
a printed circuit board (PCB) disposed to be spatially separated from the substrate and facing the second surface of the substrate, wherein the transmitter antenna structure is disposed on the PCB;
a control driver disposed on the PCB, configured to generate a plurality of scan signals for the gate driver; and
a plurality of protrusion contacts convexly disposed on the PCB and electrically connected to the control driver;
wherein each of the connecting structures is in direct contact with a corresponding one of the protrusion contacts, such that the control driver transmits the scan signals to the gate driver through the protrusion contacts and the connecting structures.

19. The display panel of claim 12, being a light emitting diode (LED) display panel, wherein each of the pixels comprises a LED.

20. The display panel of claim 12, being a liquid crystal display (LCD) panel, and further comprising a backlight module disposed between the receiver antenna structure and the transmitter antenna structure.

* * * * *